(12) United States Patent
Ueno et al.

(10) Patent No.: US 6,956,288 B2
(45) Date of Patent: Oct. 18, 2005

(54) SEMICONDUCTOR DEVICE WITH FOLDED FILM SUBSTRATE AND DISPLAY DEVICE USING THE SAME

(75) Inventors: Junichi Ueno, Otsu (JP); Michiharu Torii, Moriyama (JP); Takayuki Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/756,121

(22) Filed: Jan. 12, 2004

(65) Prior Publication Data

US 2004/0145052 A1 Jul. 29, 2004

(30) Foreign Application Priority Data

Jan. 29, 2003 (JP) ........................................ 2003-020976

(51) Int. Cl.[7] .............................................. H01L 23/48
(52) U.S. Cl. ...................... 257/735; 257/734; 257/736; 257/737; 257/738
(58) Field of Search ................................ 257/734–738, 257/778, 787

(56) References Cited

U.S. PATENT DOCUMENTS

| | | | | |
|---|---|---|---|---|
| 3,766,439 A | * | 10/1973 | Isaacson ...................... 361/714 |
| 5,386,341 A | * | 1/1995 | Olson et al. ................. 361/749 |
| 5,534,727 A | * | 7/1996 | Inoue .......................... 257/659 |
| 5,776,797 A | * | 7/1998 | Nicewarner et al. ........ 438/107 |
| 5,914,859 A | * | 6/1999 | Takada et al. ............... 361/704 |
| 6,208,521 B1 | * | 3/2001 | Nakatsuka ................... 361/749 |
| 6,559,522 B1 | | 5/2003 | Kang |
| 2001/0018225 A1 | | 8/2001 | Tanaka |
| 2002/0180022 A1 | * | 12/2002 | Emoto ......................... 257/686 |
| 2003/0067064 A1 | * | 4/2003 | Kim ............................ 257/686 |
| 2004/0021212 A1 | * | 2/2004 | Hamaguchi et al. ........ 257/686 |
| 2004/0115866 A1 | * | 6/2004 | Bang et al. ................. 438/125 |
| 2004/0238936 A1 | * | 12/2004 | Rumer et al. ............... 257/688 |
| 2005/0041403 A1 | * | 2/2005 | Cady et al. ................. 361/749 |

FOREIGN PATENT DOCUMENTS

| | | |
|---|---|---|
| JP | 6-349898 | 12/1994 |
| JP | 11-354589 | 12/1999 |
| JP | 2000-195898 | 7/2000 |
| JP | 2001-237280 | 8/2001 |

* cited by examiner

Primary Examiner—George Eckert
Assistant Examiner—Jesse A. Fenty
(74) Attorney, Agent, or Firm—Hamre, Schumann, Mueller & Larson, P.C.

(57) ABSTRACT

A semiconductor device to be mounted on an external electronic device includes a film substrate on which wiring electrodes are formed, the wiring electrodes being partially covered with a covering member; and a semiconductor chip mounted on the film substrate. In this semiconductor device, the film substrate is folded so that at least one edge of the film substrate is on a side opposite to a side on which the semiconductor chip is mounted, and portions of the wiring electrodes exposed from the covering member on a surface of the film substrate on which the semiconductor chip is mounted are to be connected to electrodes of an external electronic device.

17 Claims, 20 Drawing Sheets

SEMICONDUCTOR DEVICE WITH FOLDED FILM SUBSTRATE AND DISPLAY DEVICE USING THE SAME

BACKGROUND OF THE INVENTION

1. Field of the Invention

The present invention relates to a semiconductor device of the tape carrier type and a display device including the same.

2. Description of the Related Art

Thin display devices typified by liquid crystal displays employ a semiconductor device for driving that inputs display signals. Such a semiconductor device is required to be thin and produce multiple output signals. Examples of the method of mounting such a semiconductor device include using a chip-on-glass (hereinafter, referred to as "COG") structure or a tape-carrier-package (hereinafter, referred to as "TCP") structure.

First, a semiconductor device mounted on a display device so as to have a COG structure will be described. FIG. 24 is a cross-sectional view of a semiconductor device mounted on a display device so as to have a COG structure. A display glass 109 as a transparent substrate is adhered onto a glass substrate 111 as a display substrate that is connected to a back light 110 as a light source. The region without the display glass 109 on the glass substrate 111 is a region for mounting a semiconductor chip 105, and transparent electrodes 112 are formed on this region. Electrodes 108 of the semiconductor chip 105 are connected to bumps 106 as protruding electrodes. The electrodes 108 and the transparent electrodes 112 are electrically connected to each other. Between the semiconductor chip 105 and the transparent electrodes 112, an anisotropic conductive film 113 containing conductive particles is provided, and the conductive particles contained in the anisotropic conductive film 113 serve to electrically connect the electrodes 108 and the transparent electrodes 112.

Next, a semiconductor device having a TCP structure will be described. Among semiconductor devices having a TCP structure, especially the one having a chip-on-film (hereinafter, referred to as "COF") structure employs a film substrate that can be folded easily and thus can be handled easily.

Hereinafter, a semiconductor device having a COF structure will be described. FIG. 25 is a plan view of a conventional semiconductor device with a COF structure. FIG. 26 is a cross-sectional view taken in the arrow direction of line D–D' in FIG. 25.

In the conventional semiconductor device, a semiconductor chip 105 is mounted on an insulating flexible film substrate 102 formed of a polyimide or the like, on which conductive leads 104 as wiring electrodes have been formed. Electrodes 108 of the semiconductor chip 105 are connected to the conductive leads 104 via bumps 106 as protruding electrodes. The bumps 106 may have various heights. Also, it is possible to produce the semiconductor device without using the bumps 106. The conductive leads 104 typically are plated.

The space between the semiconductor chip 105 and the film substrate 102 is filled with an encapsulation resin 107 so as to encapsulate the electrodes 108 of the semiconductor chip 105, thereby protecting the surface of the electrodes 108 and securing the strength of the semiconductor device itself. Outside the region where the encapsulation resin 107 is formed, a solder resist 103 is formed. The conductive leads 104 are exposed at a portion where the solder resist 103 is not formed.

Portions of the conductive leads 104 that contain the portions electrically connected to the electrodes 108 of the semiconductor chip 105 and are encapsulated in the encapsulation resin 107 are inner leads 104a. The inner leads 104a are in intimate contact with the film substrate 102. Because flying leads liable to bend are not present, it is possible to make the conductive leads 104 thin. Therefore, as compared with conventional TCP structures, the COF structure is advantageous in that the conductive leads 104 can be etched more easily, thereby making it possible to form finer conductor patterns.

On the other hand, portions of the conductive leads 104 exposed from the solder resist 103 are outer leads 104b and 104c, which are the portions to be connected to a display device when mounting the semiconductor device on the display device.

Hereinafter, a conventional way of mounting the semiconductor device having a COF structure will be described. FIG. 27 is a cross-sectional view of the semiconductor device with a COF structure mounted on a display device. In FIG. 27, a display device includes a back light 110, a glass substrate 111, and a display glass 109 laminated in this order. A PCB (printed circuit board) substrate 114 for supplying power and signals to the semiconductor device is mounted on the back light 110 side of the glass substrate 111. The conductive leads 104c on one end of the semiconductor device having a COF structure are connected to electrodes 115 of the PCB substrate 114 via the anisotropic conductive film 113. The film substrate 102 is bent toward the semiconductor chip 105 side, and the outer leads 104b on the other end of the semiconductor device are connected to the transparent electrodes 112 formed on the display glass 109 side of the glass substrate 111 via the anisotropic conductive film 113.

In the display device having the above-described configuration, power and signals supplied from the PCB substrate 114 are input to the semiconductor chip 105 from the outer leads 104c. After being processed by the semiconductor chip 105, the power and signals are transmitted from the outer leads 104b to the glass substrate 111 via the transparent electrodes 112.

In the conventional semiconductor device having a COF structure, the film substrate 102 is formed so as to extend from one surface to the other surface of the glass substrate 111. Thus, the film substrate 112 is required to have a long length, which brings about the problem in that the cost of the semiconductor device is increased due to the high cost of the film substrate. Another problem is that, because a plurality of the same driving ICs are mounted, the PCB substrate 114 for supplying them with power and signals for operating a semiconductor chip needs to be provided, which increases the cost of the display device.

In the case of the semiconductor device mounted on a display device so as to have a COG structure as described above, no cost is required for a film because no film is used therein. However, because rigid substrates such as the semiconductor chip 105 and the glass substrate 111 are joined to each other via the bumps 106, variations in height of the bumps 106 are liable to occur and cause unstable contact at the joined portion, which may result in bad electrical contact between the semiconductor chip 105 and the glass substrate 111. In addition, because the semiconductor device is mounted on the glass substrate 111 directly with only an ACF (anisotropic conductive film) or the like intervening therebetween, the display device is susceptible to the influence of the heat generated by the semiconductor chip 105 and mechanical stress caused by the difference in thermal expansion coefficient among the semiconductor chip 105, the glass substrate 111, and the anisotropic conductive film 113. This may bring about the problem in that the deterioration of the quality of display, such as irregularity in display or the like, occurs in the vicinity of the portion for mounting the semiconductor device.

Other examples of a semiconductor device having a COF structure are disclosed in JP 6(1994)-349898 A, JP 11(1999)-354589 A, JP 2000-195898 A, JP 2001-237280 A, etc.

SUMMARY OF THE INVENTION

Therefore, with the foregoing in mind, it is an object of the present invention to provide a semiconductor device having a COF structure that can be produced at low cost and, when mounted on a display device, can reduce the influence of its heat generation on the display device to prevent the deterioration of the quality of display, and a display device using the same.

A semiconductor device according to the present invention is a semiconductor device to be mounted on an external electronic device, including: a film substrate on which wiring electrodes are formed, the wiring electrodes being partially covered with a covering member; and a semiconductor chip mounted on the film substrate. In this semiconductor device, the film substrate is folded so that at least one edge of the film substrate is on a side opposite to a side on which the semiconductor chip is mounted, and portions of the wiring electrodes exposed from the covering member on a surface of the film substrate on which the semiconductor chip is mounted are to be connected to electrodes of the external electronic device. Because the semiconductor device according to the present invention is configured so that the semiconductor chip is mounted on the film substrate, it can be formed into a desired shape easily by folding the film substrate. Therefore, it is possible to make the volume of the semiconductor device smaller, thereby allowing the semiconductor device to be mounted in a small space. Besides, in the semiconductor device having the above-described configuration, it is not necessary to form the film substrate so as to extend over both surfaces of a transparent substrate of a display device, for example. Thus, the film substrate does not need to have a large area, which allows the semiconductor device to be produced at low cost.

The semiconductor chip may be configured so that it includes protruding electrodes and is connected to the wiring electrodes formed on the film substrate via the protruding electrodes.

Furthermore, it is preferable that the semiconductor device further includes an electronic-component-mounting region on which an electronic component is mounted on the surface of the film substrate on which the semiconductor chip is mounted, wherein the film substrate is folded so that the electronic-component-mounting region is on the side opposite to the side on which the semiconductor chip is mounted. According to this configuration, a space required for mounting the semiconductor device remains the same even in the case where an electronic component is provided in the semiconductor device. Thus, an increase in the size of the semiconductor device due to the electronic component can be avoided.

The electronic component may include at least one of a resistor and a capacitor.

It is preferable that a recess or a through hole is formed on an inner peripheral surface of a bent portion of the folded film substrate. Because the recess or the through hole makes the folding of the film substrate easier, the height of the semiconductor device after being mounted can be made smaller, which allows the size of the semiconductor device to be smaller.

Furthermore, it is preferable that the semiconductor device further includes a heat dissipation member that is in intimate contact with the semiconductor chip, and the heat dissipation member is provided on a side opposite to a film substrate side of the semiconductor chip. According to this configuration, when the semiconductor device is mounted on a display device, for example, an influence of the heat on a display substrate can be reduced so that deficiencies in display can be prevented from occurring. In addition, the influence of mechanical stress caused by the difference in thermal expansion coefficient also can be prevented.

Also, the semiconductor device may be configured so that it further includes a cooling device that is in intimate contact with the semiconductor chip, and the cooling device is provided on a side opposite to a film substrate side of the semiconductor chip.

Furthermore, it is preferable that a heat insulating layer is formed in a space defined by the film substrate and a part of the film substrate brought on the side opposite to the side on which the semiconductor chip is mounted by the folding. According to this configuration, when the semiconductor device is mounted on a display device, for example, an influence of the heat on a display substrate can be reduced so that deficiencies in display can be prevented from occurring. In addition, an influence of mechanical stress caused by the difference in thermal expansion coefficient also can be prevented.

Furthermore, it is preferable that a cooling device is formed in a space defined by the film substrate and a part of the film substrate brought on the side opposite to the side on which the semiconductor chip is mounted by the folding. According to this configuration, when the semiconductor device is mounted on a display device, for example, an influence of the heat on a display substrate can be reduced so that deficiencies in display can be prevented from occurring. In addition, an influence of mechanical stress caused by the difference in thermal expansion coefficient also can be prevented.

A display device according to the present invention includes a display substrate; a transparent substrate provided on a surface of the display substrate; transparent electrodes formed on the surface of the display substrate, the transparent electrodes being formed on a portion without the transparent substrate on the surface of the display substrate; and a semiconductor device connected to the transparent electrodes. The semiconductor device includes a film substrate on which wiring electrodes are formed, the wiring electrodes being partially covered with a covering member; and a semiconductor chip mounted on the film substrate, wherein the film substrate is folded so that at least one edge of the film substrate is on a side opposite to a side on which the semiconductor chip is mounted, and portions of the wiring electrodes exposed from the covering member on a surface of the film substrate on which the semiconductor chip is mounted are connected to the transparent electrodes. Since the display device according to the present invention includes the semiconductor device having the above-described configuration, it can be produced at low cost. In addition, because an influence of the heat generated by the semiconductor chip is reduced, the problems of deficiencies in display or the like can be reduced.

Furthermore, it is preferable that, in a state where the semiconductor device is connected to the transparent electrodes, a mounting height of the semiconductor device as measured from the surface of the display substrate is smaller than a thickness of the transparent substrate. Thus, the semiconductor device does not increase the thickness of the display device.

Furthermore, it is preferable that, in a state where the semiconductor device is connected to the transparent electrodes, an orthogonal projection of the semiconductor device projected on the surface of the display substrate is in a portion without the transparent substrate on the surface of the display substrate and is accommodated within the display substrate. Thus, the semiconductor device does not increase a planar size of the display device.

Furthermore, it is preferable that a plurality of the semiconductor devices are provided adjacent to each other, and connection between each two adjacent semiconductor devices is achieved via a connecting wire formed on the display substrate. According to this configuration, it is possible to sequentially transmit power, signals, and the like to a plurality of semiconductor devices adjacent to each other.

Furthermore, it is preferable that each of the semiconductor devices includes a through wire for transmitting power common to all the semiconductor devices or signals, the through wire is provided in a space between the semiconductor chip and the film substrate in each of the semiconductor devices, and the power common to all the semiconductor devices or the signals transmitted via the through wire are transmitted sequentially to the semiconductor chips of the semiconductor devices adjacent to each other via the connecting wires. According to this configuration, the through wires that can transmit the power and signals input therein and output them as they are can be provided without requiring an additional space for mounting them. This eliminates the necessity of using a PCB substrate.

The through wire may be formed on the film substrate of each of the semiconductor devices.

Furthermore, it is preferable that the through wire is formed on the semiconductor chip of each of the semiconductor devices. With this configuration, the power and signals are input to input wires formed on the film substrate and then transmitted to the through wire formed on the semiconductor chip as a component different from the film substrate. Since the input wires and the through wire are formed on the different components, various wiring patterns are possible. The degree of freedom in layout thus can be increased.

These and other advantages of the present invention will become apparent to those skilled in the art upon reading and understanding the following detailed description with reference to the accompanying drawings

DETAILED DESCRIPTION OF THE INVENTION (Embodiment 1)

Hereinafter, a semiconductor device and a display device according to Embodiment 1 of the present invention will be described with reference to the accompanying drawings.

Figure 1:
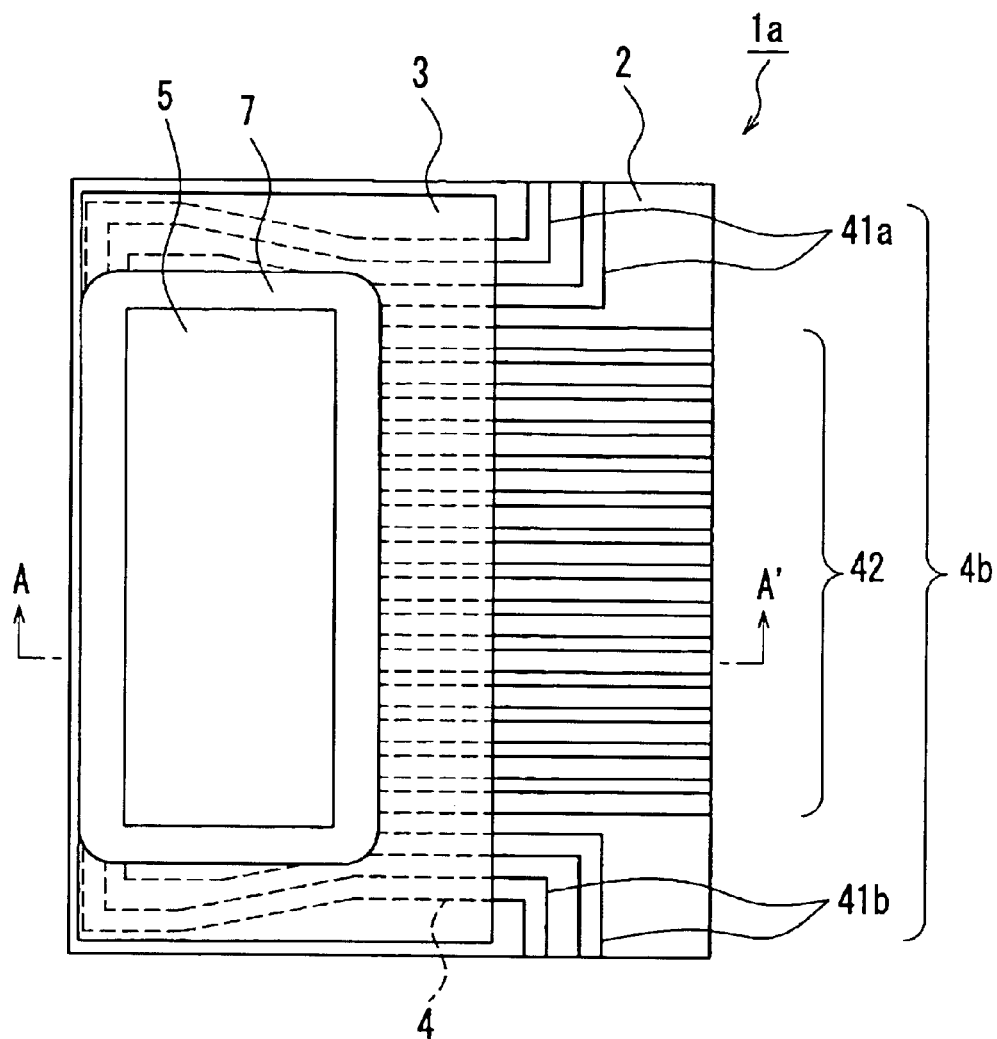
FIG. 1 is a plan view of a semiconductor device according to Embodiment 1 of the present invention.
Figure 2:
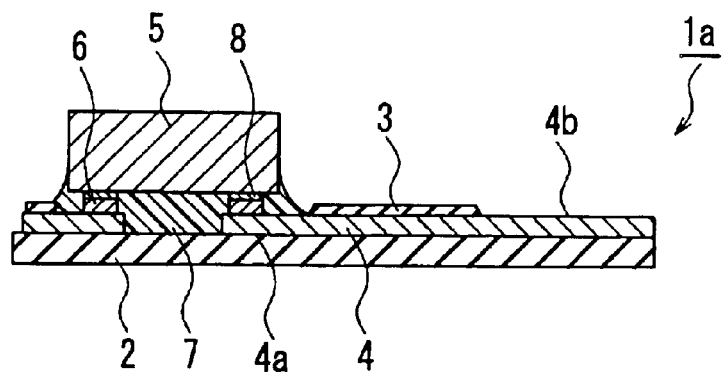
FIG. 2 is a cross-sectional view taken in the arrow direction of line A–A' in FIG. 1.

FIG. 1 is a plan view of a semiconductor device according to Embodiment 1 of the present invention, and FIG. 2 is a cross-sectional view taken along in the arrow direction of line A–A' in FIG. 1. In a semiconductor device 1a, a semiconductor chip 5 is mounted on an insulating flexible film substrate 2 formed of a polyimide or the like, on which conductive leads 4 as wiring electrodes have been formed using a metal foil such as a copper foil. Metal electrodes 8 of the semiconductor chip 5 are connected to the conductive leads 4 via bumps 6 as protruding electrodes. The bumps 6 may have various heights. Also, it is possible to produce the semiconductor device without using the bumps 6. The conductive leads 4 typically are plated.

The space between the semiconductor chip 5 and the film substrate 2 is filled with an encapsulation resin 7 so as to encapsulate the metal electrodes 8 of the semiconductor chip 5, thereby protecting the surface of the metal electrodes 8 and securing the strength of the semiconductor device 1a itself. Outside the region where the encapsulation resin 7 is formed, a solder resist 3, which serves as a covering member, is formed so as to cover a part of the conductive leads 4. The conductive leads 4 are exposed at a portion where the solder resist 3 is not formed.

Portions of the conductive leads 4 that contain the portions electrically connected to the metal electrodes 8 of the semiconductor chip 5, are encapsulated in the encapsulation resin 7, and are in intimate contact with the film substrate 2 are inner leads 4a. On the other hand, portions of the conductive leads 4 that are exposed from the solder resist 3 are outer leads 4b, which are the portions to be connected to a display device when mounting the semiconductor device on the display device. As shown in FIG. 1, the outer leads 4b include input wires 41a and output wires 41b that are both bent and display signal wires 42 that are straight.

Figure 3:
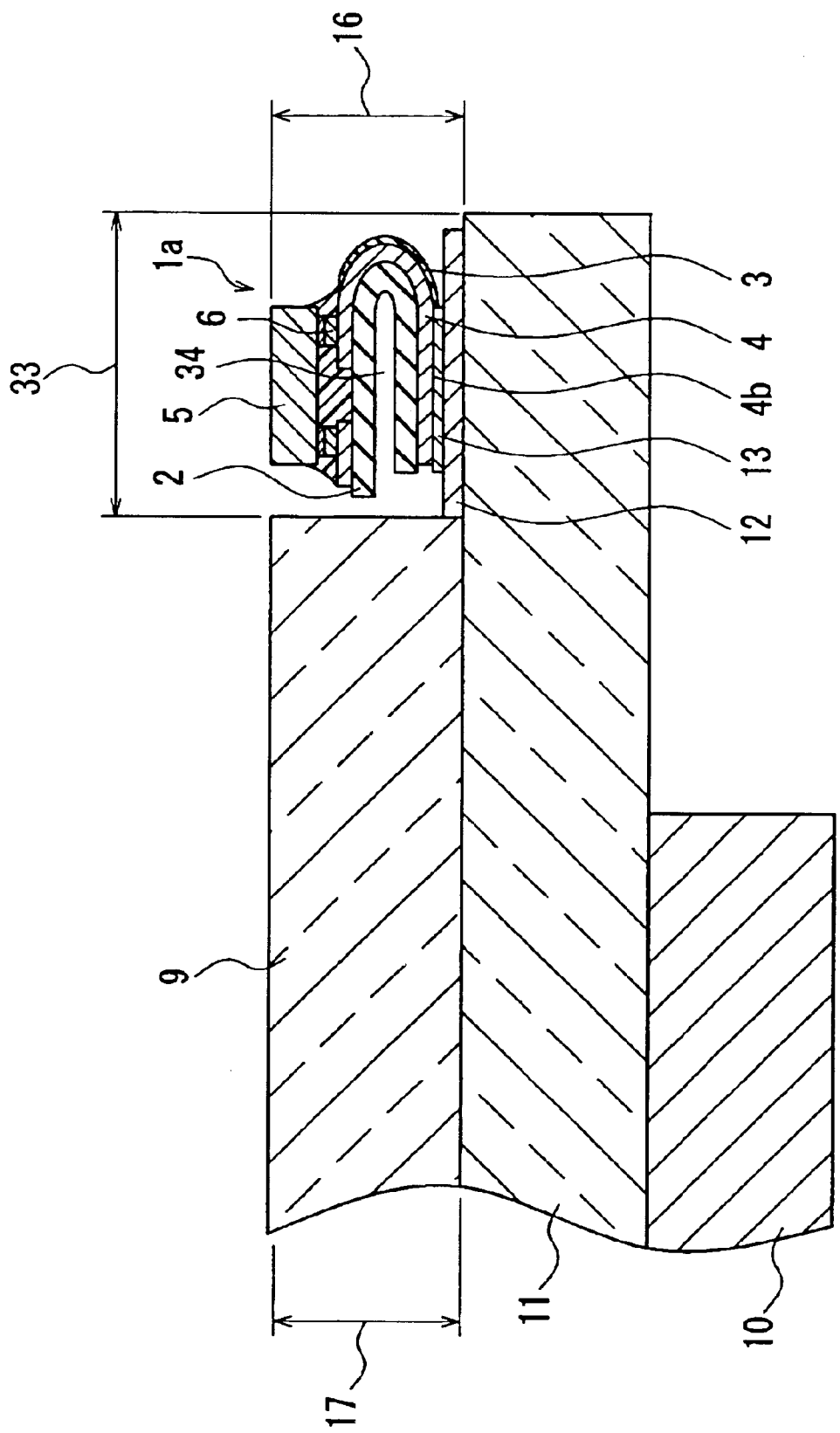
FIG. 3 is a cross-sectional view for illustrating how the semiconductor device according to Embodiment 1 of the present invention is mounted.

Although FIGS. 1 and 2 show the state where the film substrate 2 is flat, the film substrate 2 is folded when mounting the semiconductor device 1a. In the following, a display device according to Embodiment 1 of the present invention will be described. FIG. 3 is a cross-sectional view for illustrating how the semiconductor device according to Embodiment 1 of the present invention is mounted on a display device.

As shown in FIG. 3, the shape of the semiconductor device 1a specifically is such that the film substrate 2 is folded so that a part of the film substrate 2 is in proximity to the film substrate 2 on the side opposite to the surface on which the semiconductor chip 5 is mounted, and the surface on which the outer leads 4b are formed faces toward the direction opposite to the surface on which the semiconductor chip 5 is mounted.

In FIG. 3, the display device on which the semiconductor device 1a is mounted includes, for example, a back light 10, a glass substrate 11 as a display substrate, and a display glass 9 as a transparent substrate laminated in this order. In a display device employing a light emitting device such as an EL (electroluminescent) device, the back light 10 is not necessary.

On transparent electrodes 12 formed on the display glass 9 side of the glass substrate 11, an anisotropic conductive film 13 or the like is formed, on which the semiconductor device 1a is mounted. As described above, in the semiconductor device 1a, the film substrate 2 is folded so that a part of film substrate 2 is on the side opposite to the semiconductor chip 5 side. The outer leads 4b are connected to the transparent electrodes 12 of the display glass 9 via the anisotropic conductive film 13. Thus, the outer leads 4b and the transparent electrodes 12 are electrically connected to each other.

When the semiconductor device 1a is mounted in the above-described manner, it is preferable that the upper surface of the semiconductor device 1a (i.e., the rear surface of the semiconductor chip 5) is below the upper surface of the display glass 9. In other words, it is preferable that the mounting height 16 corresponding to the total length of the semiconductor device 1a, the anisotropic conductive film 13, and the transparent electrodes 12 in the thickness direction is smaller than the thickness 17 of the display glass 9. Furthermore, it is preferable that the width of the semiconductor device 1a mounted on the display device is smaller than the width 33 of the region for mounting the semiconductor device 1a formed on the glass substrate 11. Accordingly, when the semiconductor device 1a is mounted on the display device, the semiconductor device 1a is accommodated within a space defined by the planes containing the surfaces and end faces of the glass substrate 11 and the display glass 9. Thus, there is no concern that mounting the semiconductor device 1a might increase the size of the display device.

Specifically, the thickness 17 of the display glass 9 is on the order of 400 to 500 $\mu$m, and the mounting height 16 of the semiconductor device 1a is on the order of 100 to 400 $\mu$m. The thickness 17 of the display glass 9 is selected depending on the display size or application of the display device, and the mounting height 16 of the semiconductor device 1a is selected considering the thickness of the semiconductor chip 5 and the film substrate 2 or the like.

Because the semiconductor device 1a is configured so that the semiconductor chip 5 is mounted on the film substrate 2, it can be formed into a desired shape easily by folding the film substrate 2. Thus, the volume of the semiconductor device 1a can be made smaller, which allows the semiconductor device 1a to be mounted in a small space. Furthermore, the film substrate 2 can be folded easily because it is a film, and by making the film substrate 2 thinner, it can be folded still more easily. Besides, the film substrate 2 does not need to have a large area because only one portion of the film substrate 2 is to be connected to the display device when mounting the semiconductor device 1a and it is not necessary to form the film substrate 2 so as to extend over both the surfaces of the glass substrate 11. As a result, the semiconductor device 1a can be produced at low cost. Moreover, because the display device according to Embodiment 1 employs the semiconductor device 1a according to Embodiment 1, the display device as a whole also can be produced at low cost.

In addition, due to the restorative tendency of the folded film substrate 2, the film substrate 2 and a part thereof in proximity to each other are not brought into intimate contact with each other, thereby forming a space 34. The space 34 contains air. Therefore, even when the semiconductor chip 5 generates heat, the heat is less liable to be transmitted to the glass substrate 11 because the air can serve as a heat insulating material. Moreover, because the semiconductor device 1a is less susceptible to mechanical stress caused by the difference in thermal expansion coefficient among the semiconductor chip 5, the glass substrate 11, and the anisotropic conductive film 13, it is possible to prevent the deterioration of the quality of display, such as irregularity in display or the like, from occurring in the vicinity of the portion for mounting the semiconductor device 1a.

In a display device having the above-described configuration, power, signals to the semiconductor chip 5, and the like are input to the semiconductor chip 5 from the input wires 41a shown in FIG. 1. Then, display signals are output from the semiconductor chip 5 to the glass substrate 11 via the display signal wires 42, thereby displaying an image or the like. Among the power, signals to the semiconductor chip 5, and the like that have been input from the input wires 41a, those that have not been input to the semiconductor chip 5 are output to the outside of the semiconductor device 1a from the output wires 41b.

Figure 4:
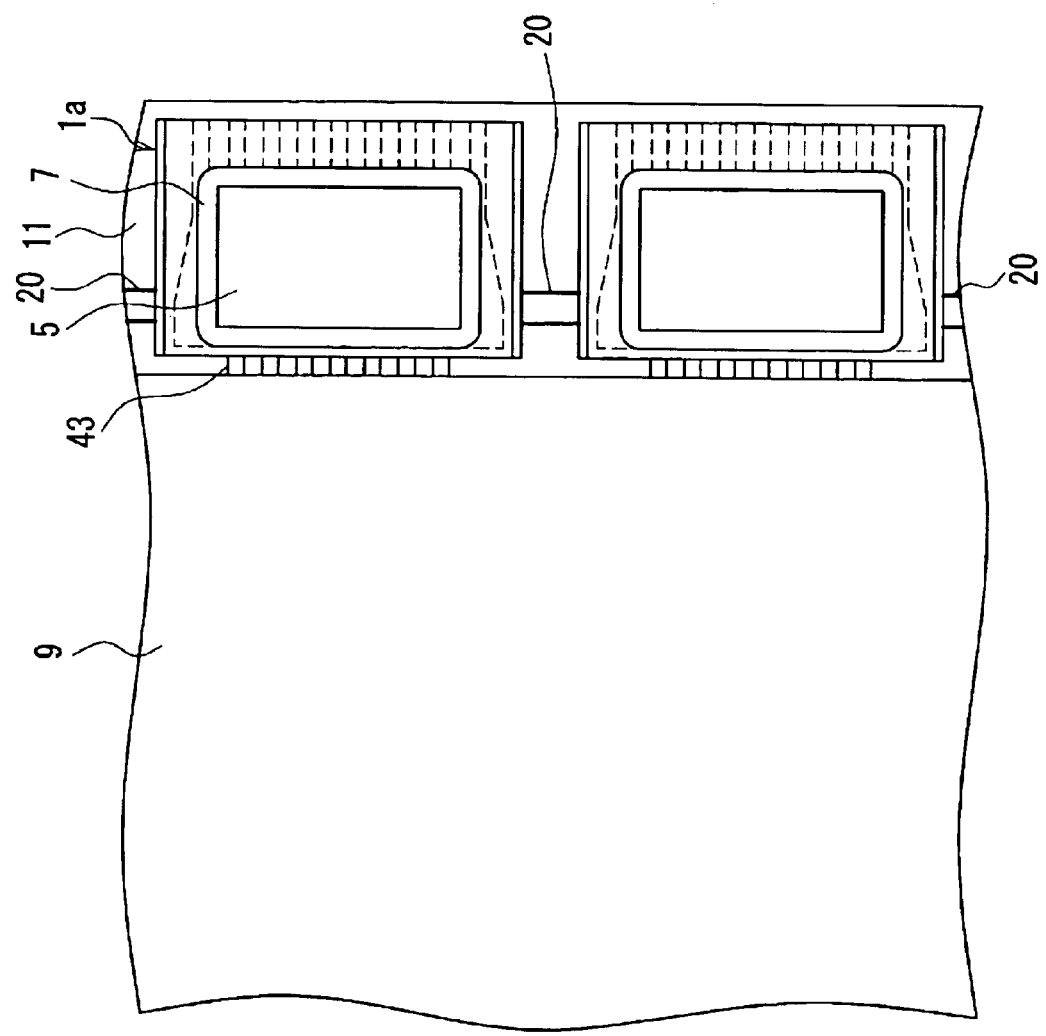
FIG. 4 is a plan view of a display device according to Embodiment 1 of the present invention.

FIG. 4 is a plan view of a display device according to Embodiment 1 of the present invention. As shown in FIG. 4, it is a general practice to mount a plurality of semiconductor devices 1a in a connected row arrangement on the glass substrate 11. In the display device according to Embodiment 1 of the present invention, power, signals to the semiconductor chip 5, and the like to be supplied to all the semiconductor devices 1a mounted on the display device are input only to the semiconductor device 1a provided at an end of the row of the semiconductor devices 1a. Therefore, it is not necessary to provide a PCB substrate for every one of the semiconductor devices 1a. The power, signals to the semiconductor chip 5, and the like to be supplied to the semiconductor device 1a at the end of the row are input via the input wires 41a shown in FIG. 1. The display signals output from the display signal wires 42 shown in FIG. 1 are transmitted to wires 43 on the glass substrate 11. On the other hand, signals and the like that have not been input to the semiconductor chip 5 are output to the outside of the semiconductor device 1a from the output wires 41b shown in FIG. 1. As shown in FIG. 4, the power and signal that have been output to the outside of the semiconductor device 1a are transmitted to a semiconductor device 1a adjacent thereto via a connecting wire 20 provided on the glass substrate 11. The adjacent semiconductor device 1a receives the power and signals from the input wires 41a, operates the semiconductor chip 5, and transmit the signals and the like other than those used for operating the semiconductor chip 5 to a semiconductor device 1a adjacent thereto (not shown) via a connecting wire 20 in the same manner as described above. In this manner, power and signals are transmitted sequentially to the semiconductor devices 1a connected in series in a row arranged so that the semiconductor devices 1a on the entire display screen are operated.

Figure 5:
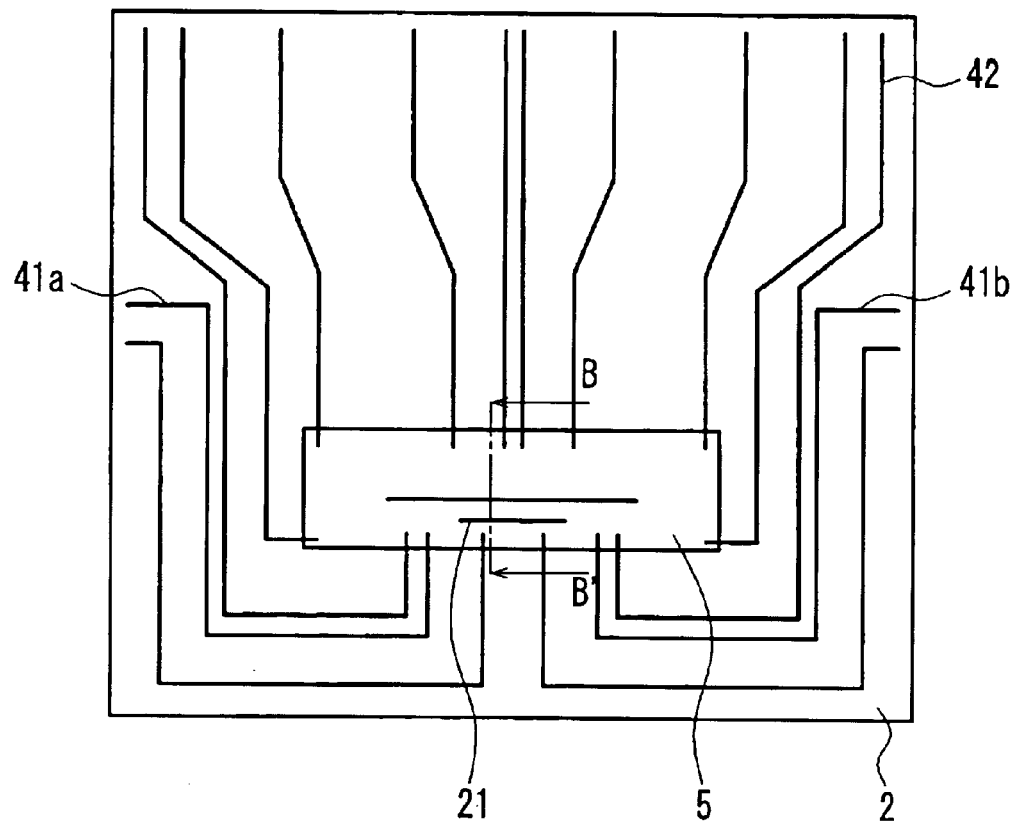
FIG. 5 is a plan view schematically showing a wiring pattern in the semiconductor device according to Embodiment 1 of the present invention.

FIG. 5 is a plan view schematically showing a wiring pattern in the semiconductor device according to Embodiment 1 of the present invention. To the semiconductor chip 5 mounted on the film substrate 2, the display signal wires 42, the input wires 41a, and the output wires 41b are connected. In the semiconductor device 1a, through wires 21 further are provided. The through wires 21 transmit the power common to all the semiconductor devices 1a provided in a connected row arrangement, signals, and the like to the output wires 41b from the input wires 41a. The through wires 21 are arranged in a space between the semiconductor chip 5 and the film substrate 2. Although it is not shown in the drawing, the through wires 21 are connected to the input wires 41a and transmit the power common to all the semiconductor devices 1a, signals, and the like to the output wires 41b.

Figure 6:
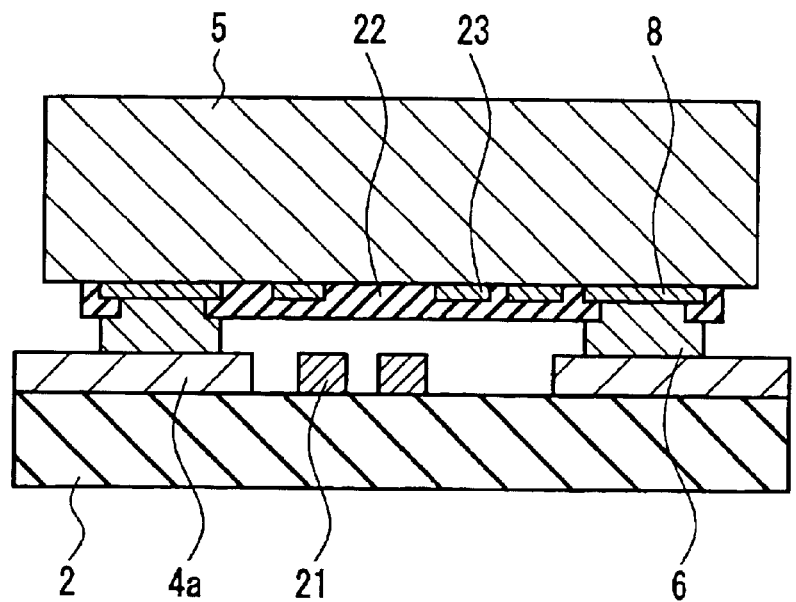
FIG. 6 is a cross-sectional view taken in the arrow direction of line B–B' in FIG. 5.

FIG. 6 is a cross-sectional view taken in the arrow direction of line B–B' in FIG. 5. The inner leads 4a are formed on the upper surface of the film substrate 2. The inner leads 4a are connected to the metal electrodes 8 of the semiconductor chip 5 via the bumps 6. Wires 23 provided in the semiconductor chip 5 are formed on the semiconductor chip 5 and protected by being covered with a surface protective film 22. The through wires 21 for transmitting the power common to all the semiconductor devices 1a, signals, and the like are formed on the film substrate 2. By providing the through wires 21 in this manner, the receipt and transmission of the power that is common to all the semiconductor devices 1a adjacent to each other, signals, and the like become possible.

Figure 7:
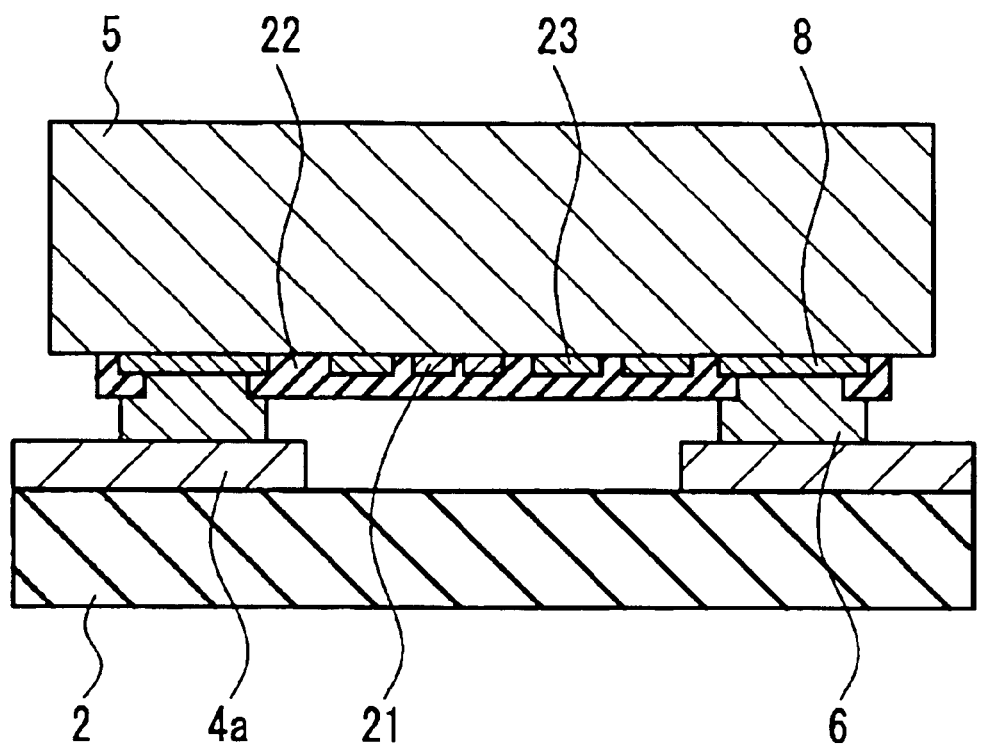
FIG. 7 is a cross-sectional view of a semiconductor device different from that shown in FIG. 6, taken in the arrow direction of line B–B' in FIG. 5.

FIG. 7 is a cross-sectional view of a semiconductor device different from that shown in FIG. 6, taken in the arrow direction of line B–B' in FIG. 5. As shown in FIG. 7, the through wires 21, as well as the wires 23 of the semiconductor chip 5, are provided on the semiconductor chip 5. Thus, as shown in FIG. 5, the input wires 41a provided on the film substrate 2 and the through wires 21 provided on the semiconductor chip 5 are connected to each other. For example, it is possible to connect the input wires 41a provided inside the film substrate 2 to the through wires 21 provided outside the film substrate 2. Therefore, three-dimensional wiring becomes possible, thereby increasing the degree of freedom in layout.

As described above, in the semiconductor device 1a, power common to all the semiconductor devices 1a, signals, and the like input from the input wires 41a can be transmitted to the output wires 41b via the through wires 21. Therefore, as shown in FIG. 4, in the display device in which a plurality of the semiconductor devices 1a are provided in a connected row arrangement on the glass substrate 11, power and signals need to be supplied only to the semiconductor device 1a at an end of the row of the semiconductor devices 1a and the necessity of providing a PCB substrate for every one of the semiconductor devices 1a as in conventional display devices thus can be eliminated. This allows the display device to be made smaller and produced at lower cost.

Figure 8:
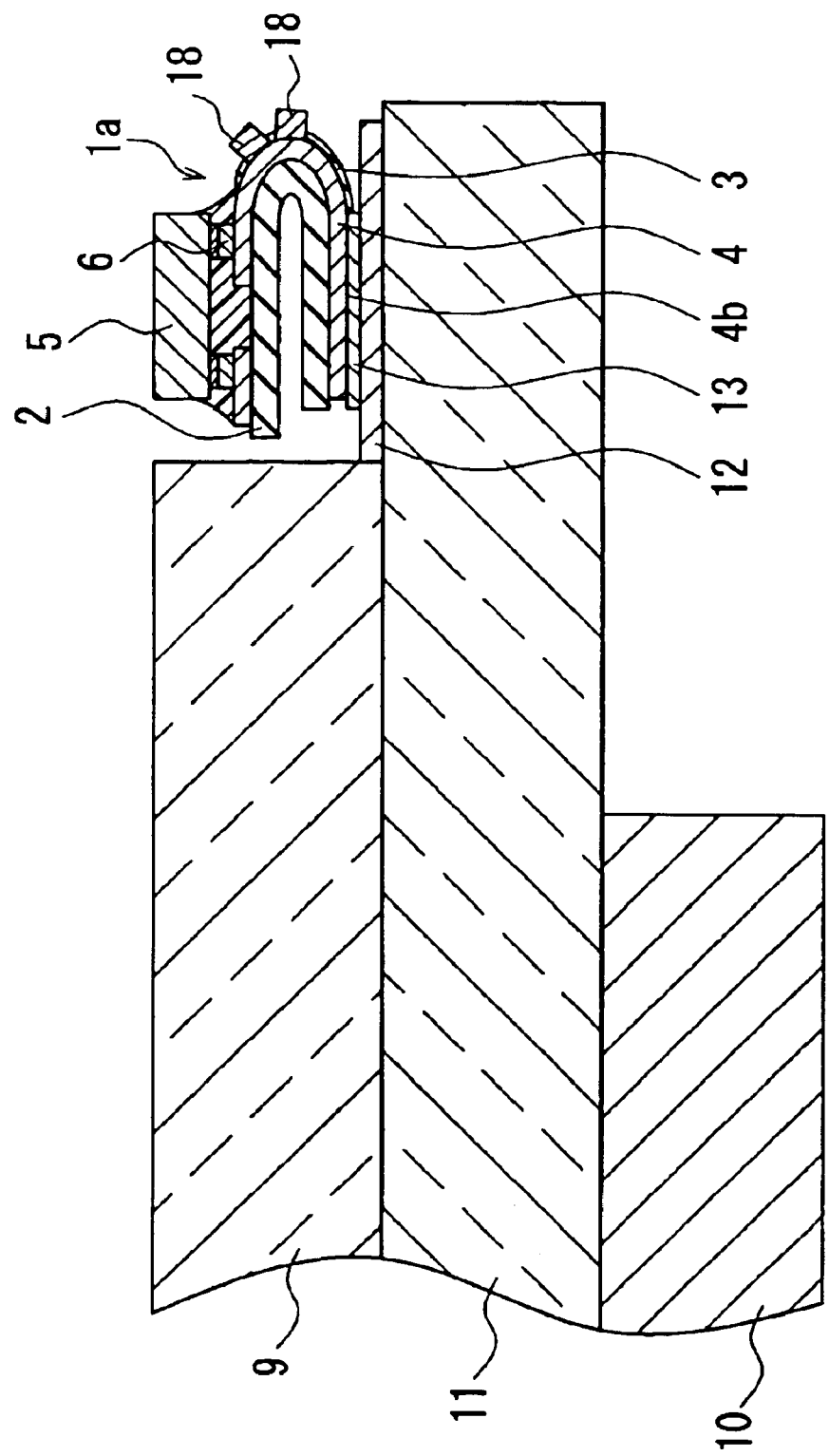
FIG. 8 is a cross-sectional view of another display device according to Embodiment 1 of the present invention.

FIG. 8 is a cross-sectional view of another display device according to Embodiment 1 of the present invention. In the case where electronic components 18, e.g., a capacitor and a resistor, are provided in the semiconductor device 1a, these electronic components 18 may be provided in a portion other than the portion with the outer leads 4b, which serves as a mounting surface, and the portion on which the semiconductor chip 5 is mounted, as shown in FIG. 8. The electronic components 18 may penetrate through the solder resist 103 to be joined to the conductive leads 4 with solder or the like. In this case, in order to prevent the detachment or insufficient joint of the electronic components 18 due to the folding of the film substrate 2, it is desirable to consider the direction and the position in which the electronic components 18 are mounted.

In the semiconductor device 1a, the thickness of the film substrate 2 preferably is greater than 0 $\mu$m and not greater than 50 $\mu$m. When the film substrate 2 has a thickness in this range, the film substrate 2 can be folded appropriately to form a desired shape. For example, as a result of the comparison between a film substrate of 38 $\mu$m thickness and a film substrate of 75 $\mu$m thickness, it was found that the film substrate of 38 $\mu$m thickness was folded until a bend angle of about 30° was achieved while the film substrate of 75 $\mu$m thickness was folded until a bend angle of about 60° was achieved. That is, the film substrate of 38 $\mu$m thickness is twice as flexible as the film substrate of 75 $\mu$m thickness. If the film substrate 2 has a thickness of greater than 50 $\mu$m, the restorative force generated after the folding becomes too great. In order to reduce the mounting height of the semiconductor device 1a, it is advantageous that the film substrate 2 is flexible. When the thickness of the film substrate 2 is not greater than 50 $\mu$m, the mounting height of the semiconductor device 1a can be reduced stably.

Furthermore, the thickness of the conductive leads 4 preferably is set in the range of not smaller than 3 $\mu$m and not greater than 12 $\mu$m. When the conductive leads 4 have a thickness in this range, the conductive leads 4 can bend flexibly along with the film substrate 2 when the film substrate 2 is folded. Therefore, the film substrate 2 can be folded appropriately to form a desired shape.

For example, in the case where the thickness of the conductive leads 4 is set to 15 μm, which is greater than 12 μm, the difference in curvature between the inner periphery and the outer periphery of the bent portion of the conductive leads 4 becomes too great. As a result, cracks are liable to be generated on the outer peripheral surface of the conductive leads 4, which brings about the risk of breakage of the conductive leads 4. As a result of a repeat bending test performed to compare a conductive lead 4 of 15 μm thickness and a conductive lead 4 of 12 μm thickness, it was found that the number of times the conductive lead 4 of 15 μm thickness was bent until it broke was about 70% less than that of the conductive lead 4 of 12 μm thickness. That is, the conductive leads 4 of 15 μm thickness have a degraded resistance to bending.

Furthermore, because the conductive leads 4 have a surface roughness of 1 to 2 μm and exhibit variations in shape, the mechanical strength of the conductive leads 4 cannot be stable when the thickness thereof is smaller than 3 μm. In the worst case, the strength of the conductive leads 4 decreases significantly so that the conductive leads 4 might be broken when being bent. On this account, it is preferable that the thickness of the conductive leads 4 is set in the range of not smaller than 3 μm and not greater than 12 μm.

The thickness of the semiconductor chip 5 preferably is set in the range of not smaller than 50 μm and not greater than 350 μm. By so doing, when the semiconductor device 1a is mounted on the glass substrate 11 as shown in FIG. 3, the mounting height 16 can be 400 μm or smaller. When the thickness 17 of the display glass 9 is smaller than 400 μm, the strength of the display glass 9 decreases significantly, thereby bringing about a problem in that, for example, the display glass 9 might be broken during shipping. Thus, the thickness 17 of the display glass 9 is at least 400 μm. Therefore, the semiconductor device 1a can be accommodated within the thickness 17 of the display glass 9. On the other hand, when the thickness of the semiconductor chip 5 is smaller than 50 μm, the diffusion layer forming the circuit of the semiconductor chip 5 might be deformed in the process of grinding the rear surface of the silicon wafer as a process that determines the thickness of the chip. This might cause adverse effects on the circuit characteristics of the semiconductor chip 5.

Figure 9:
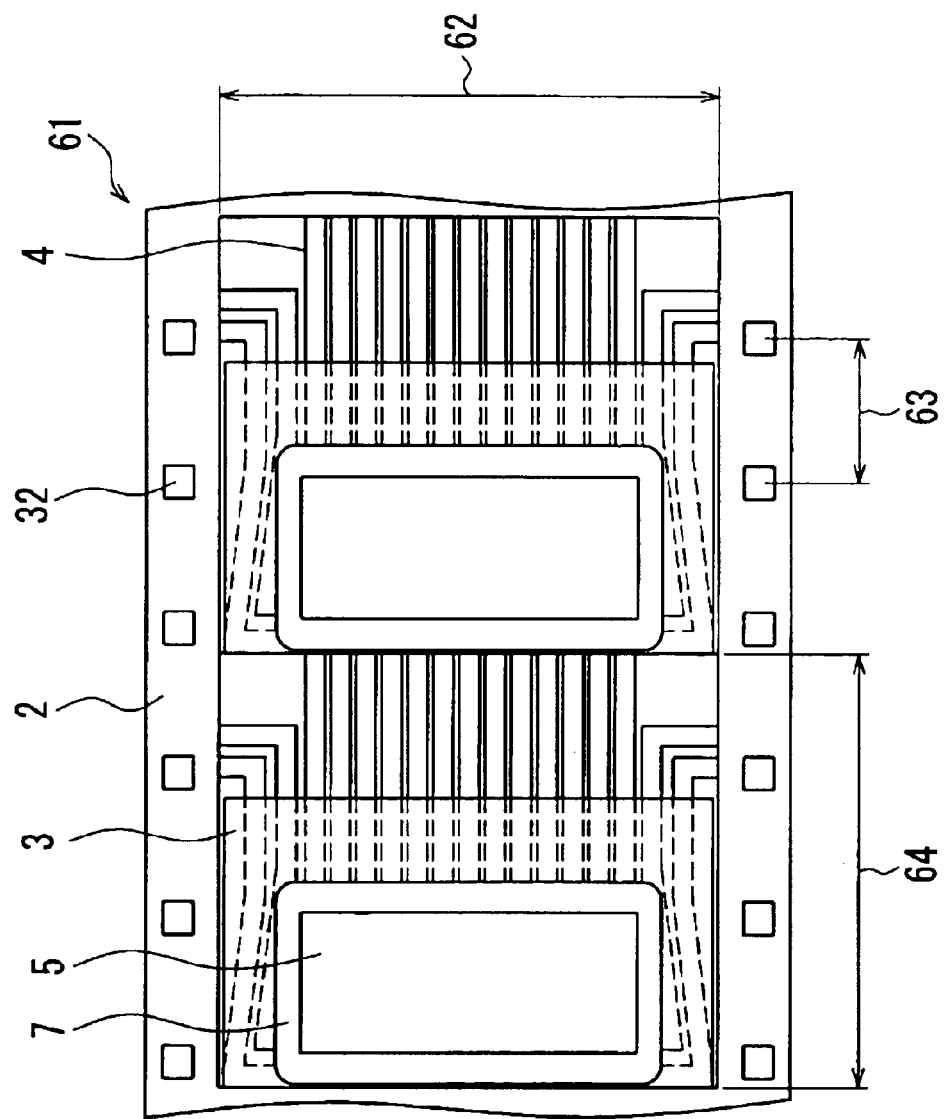
FIG. 9 is a plan view of a plurality of semiconductor devices formed on a film substrate that has not yet been punched out.

Hereinafter, the size of the semiconductor device 1a will be described. FIG. 9 is a plan view of a plurality of semiconductor devices formed on a film substrate that has not yet been punched out. A semiconductor device having a COF structure may be formed in the following manner. On a continuous film substrate 61 to be supplied in the form of a roll, conductive leads 4, semiconductor chips 5, solder resists 3, encapsulation resins 7, and the like are formed continuously so that a plurality of semiconductor devices 1a are formed continuously on this continuous substrate 61. Thereafter, each of the semiconductor devices 1a is punched out from the continuous film substrate 61.

The width 62 of the continuous film substrates 61 and a pitch 63 with which sprocket holes 32 are arranged are determined in accordance with the standard. The sprocket holes 32 are provided so that projections in a device for feeding the continuous film substrates 61 are engaged therein during the respective manufacturing processes of the semiconductor devices 1a. The pitch 63 of the sprocket holes 32 is determined in accordance with the standard, and generally is 4.75 mm.

The length 64 of the semiconductor device 1a may be about twice the width 33 of the region for mounting the semiconductor device 1a formed on the glass substrate 11 shown in FIG. 3. However, the semiconductor device 1a generally is formed so as to have a length corresponding to an integral multiple of the pitch of the sprocket holes 32. Therefore, since the minimum integral multiple of the distance between two adjacent sprocket holes 32 is 4.75 mm, the length 64 of the semiconductor device 1a is at least 4.75 mm. The length 64 of the semiconductor device 1a may be set to a value that is not less than twice the width 33 of the region for mounting the semiconductor device 1a and corresponds to an integral multiple of 4.75 mm that is closest to the value twice the width 33.

For example, when the length of the semiconductor chip 5 in the length 64 direction of the semiconductor device 1a is about 3 mm, the surface of the glass substrate 11 on which the semiconductor device 1a to be mounted needs to have a width of about 6 mm to accommodate the encapsulation region in addition to the semiconductor chip 5. Considering the folding of the film substrate 2, the length 64 of the semiconductor device 1a needs to be about twice the length of the semiconductor device 1a when mounted on the glass substrate 11. Thus, in this case, the length 64 of the semiconductor device 1a is 6 mm×2=12 mm. Furthermore, in order to arrange a probe needle contact pad to carry out an electrical test on the semiconductor device 1a, a length of about 2 mm corresponding to the height of this contact pad further is needed. Therefore, the minimum length required for each one of the semiconductor devices provided continuously on the continuous film substrate 61 in the form of a roll is 12 mm+2 mm=14 mm. However, each one of the semiconductor devices 1a provided continuously generally is formed so as to have a length 64 corresponding to an integral multiple of the pitch of the sprocket holes 32. The value twice the pitch of the sprocket holes 32, which is 9.5 mm, is not sufficient. Thus, 14.25 mm, which is the value three times the pitch of the sprocket holes 32, is required.

Figure 10:
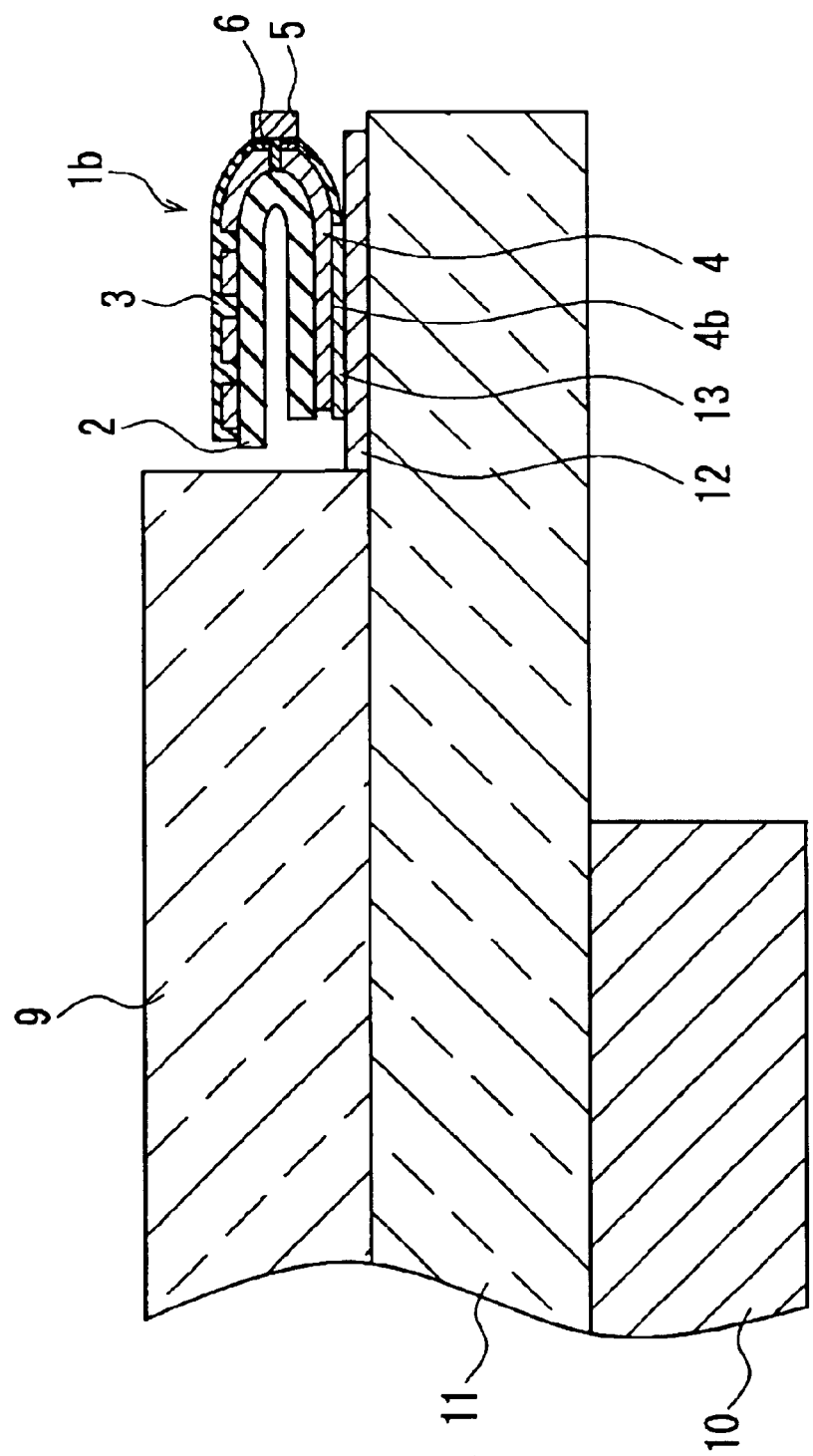
FIG. 10 is a cross-sectional view of still another display device according to Embodiment 1 of the present invention.

Furthermore, as shown in FIG. 3, in the case where the semiconductor chip 5 has a great width, the semiconductor chip 5 is mounted on a portion other than the bent portion of the film substrate 2. However, in the case where the width of the semiconductor chip 5 is sufficiently small, the semiconductor chip 5 may be mounted on the bent portion of the film substrate 2, for example, similarly to the electronic components 18 shown in FIG. 8. FIG. 10 is a cross-sectional view of still another display device according to Embodiment 1 of the present invention. For example, as shown in FIG. 10, the display device may include a semiconductor device 1b in which a semiconductor chip 5 is mounted on the bent portion of a film substrate 2.

(Embodiment 2)

Figure 11:
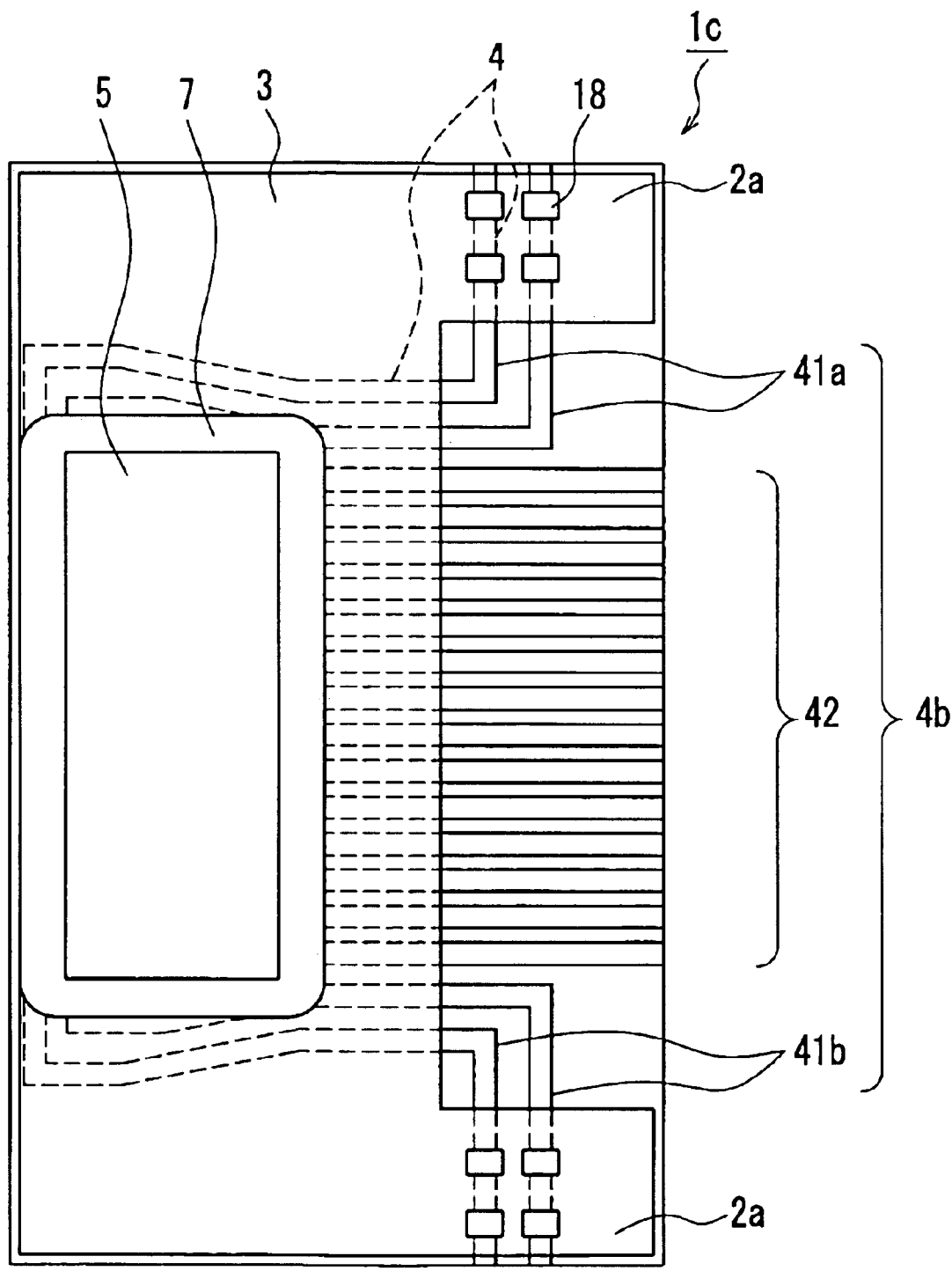
FIG. 11 is a plan view of a semiconductor device according to Embodiment 2 of the present invention.

A semiconductor device and a display device according to Embodiment 2 of the present invention will be described with reference to the accompanying drawings. FIG. 11 is a plan view of a semiconductor device according to Embodiment 2 of the present invention. A semiconductor device 1c according to Embodiment 2 has the same configuration as that of the semiconductor device 1a according to Embodiment 1 except that electronic-component-mounting regions 2a are provided on both ends of the region where the outer leads 4b are formed.

As shown in FIG. 11, the electronic-component-mounting regions 2a are portions where a solder resist 3 is formed so as to cover conductive leads 4. On the electronic-component-mounting regions 2a, electronic components 18, e.g., a capacitor and a resistor, are mounted. The electronic components 18 penetrate through the solder resist 3 to be joined to the conductive leads 4 with solder or the like.

Figure 12:
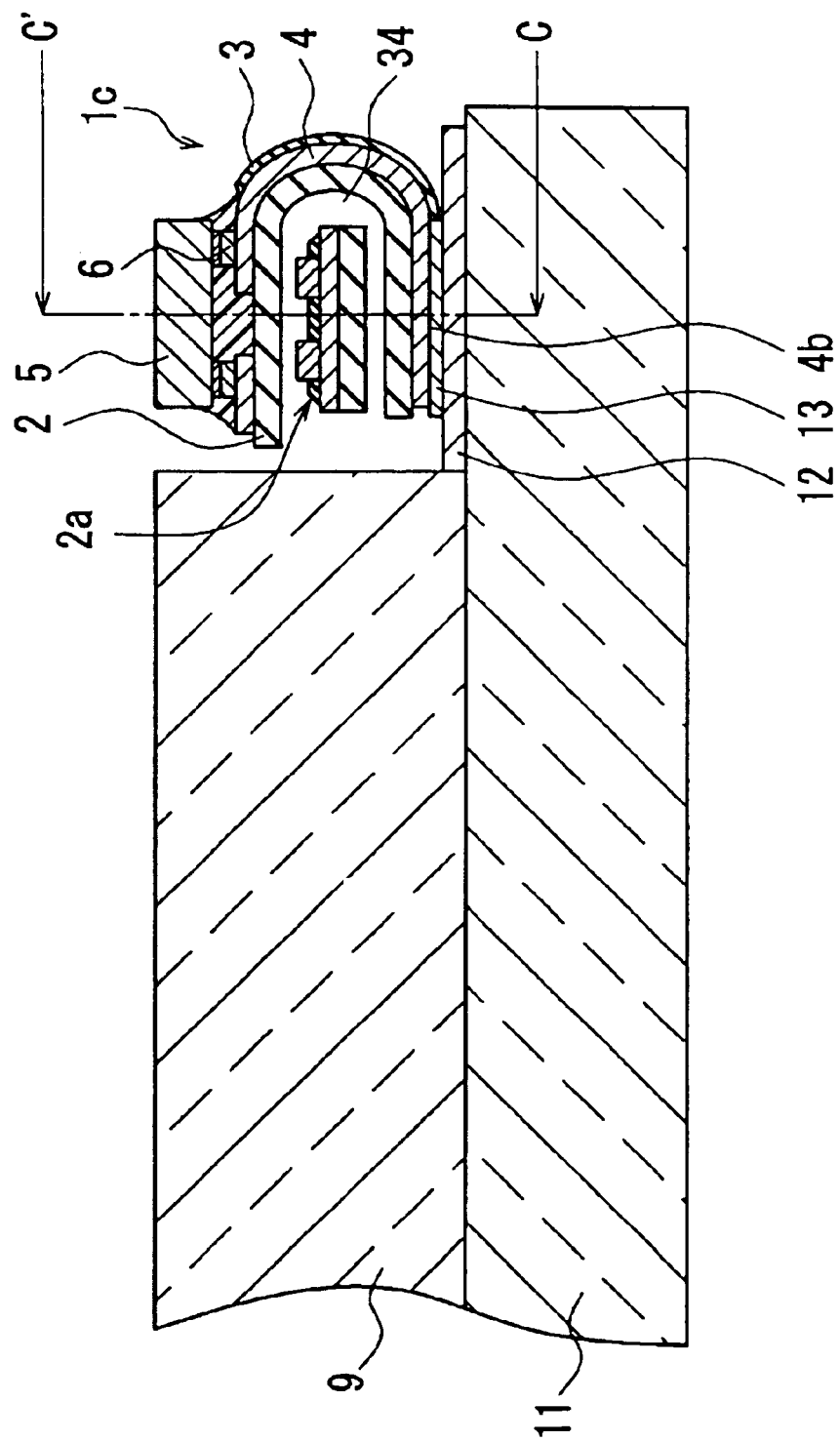
FIG. 12 is a cross-sectional view of a display device according to Embodiment 2 of the present invention.
Figure 13:
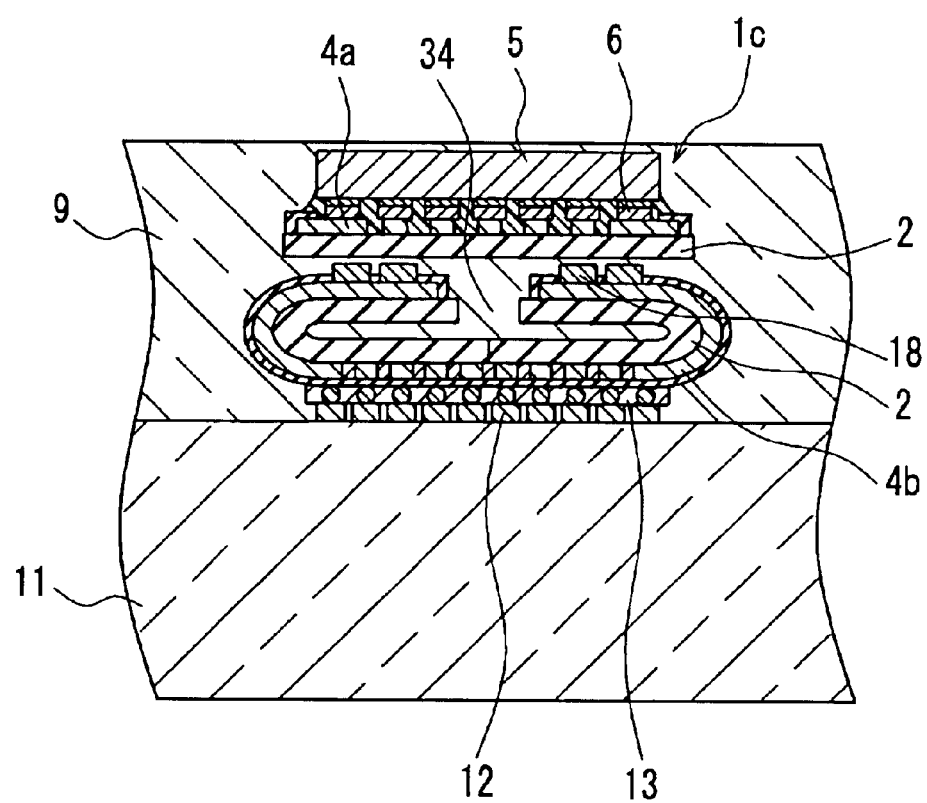
FIG. 13 is a cross-sectional view taken in the arrow direction of line C–C' in FIG. 12.

In the following, the mounting of the semiconductor device 1c having the above-described configuration will be described with reference to the accompanying drawings. FIG. 12 is a cross-sectional view of a display device according to Embodiment 2 of the present invention. FIG. 13 is a cross-sectional view taken in the arrow direction of line C–C' in FIG. 12. When mounting the semiconductor device 1c on a display device, first, a film substrate 2 is folded so that the electronic-component-mounting regions 2a are on the side opposite to the side on which the semiconductor chip 5 is mounted. In this state, the film substrate 2 further is folded so that a part of the film substrate 2 is in proximity to the film substrate 2 on the side opposite to the surface on which the semiconductor chip 5 is mounted, and the surface on which the outer leads 4b are formed faces toward the direction opposite to the surface on which the semiconductor chip 5 is mounted. It is to be noted here that, in FIGS. 12 and 13, only the vicinity of the electronic components 18 in the electronic-component-mounting regions 2a are shown for the sake of clarity.

By forming the semiconductor device 1c into the above-described shape, the electronic components 18 mounted on the electronic-component-mounting regions 2a thus interfolded are arranged in a space 34 formed by the film substrate 2. Thus, the size of the semiconductor device 1c is not increased by mounting the electronic components 18 because the electronic components 18 are arranged in the space 34, which already exists in the semiconductor device 1c. That is, even in the case where the electronic components 18 are provided in the semiconductor device 1c, an area of the region required for mounting the semiconductor device 1c is not increased.

Furthermore, it is to be noted here that the film substrate 2 may be folded not only once but also a plurality of times. The portion of the film substrate 2 on which the electronic components 18 are mounted may be interfolded into either the space 34 formed in the semiconductor device 1c or any region where the electronic components 18 do not interfere with a semiconductor device provided adjacent to the semiconductor device 1c. By so doing, a space for mounting the respective electronic components 18 can be provided effectively.

(Embodiment 3)

Figure 14:
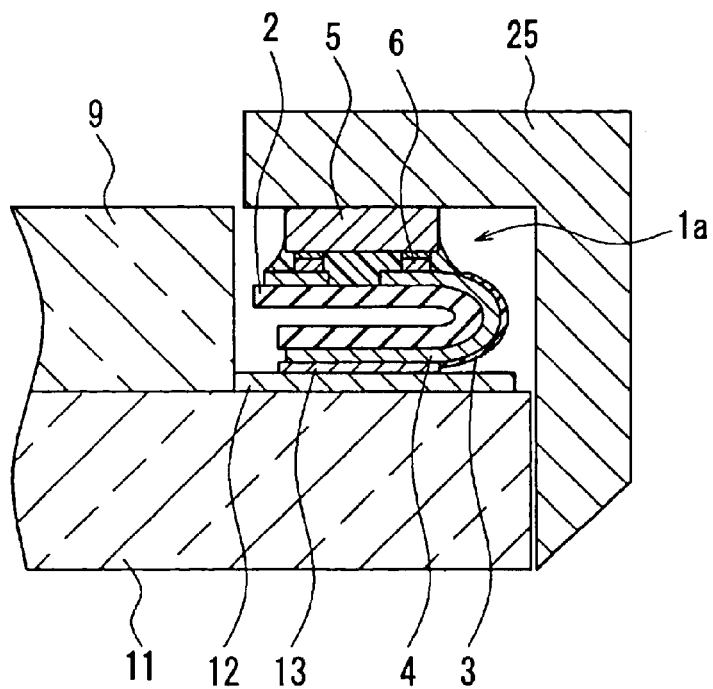
FIG. 14 is a cross-sectional view of a display device according to Embodiment 3 of the present invention.

A semiconductor device and a display device according to Embodiment 3 of the present invention will be described with reference to the accompanying drawings. FIG. 14 is a cross-sectional view of a display device according to Embodiment 3 of the present invention. In the display device according to Embodiment 3, the semiconductor device 1a is mounted in the same manner as shown in FIG. 3 in Embodiment 1 except that a housing 25 provided in the display device is in intimate contact with the rear surface of the semiconductor chip 5. In the display device, illustration of the back light has been omitted. As the housing 25, a suitable member already provided in the display device may be used. Furthermore, as the housing 25, a material having a high thermal conductivity, such as aluminum, is preferable. In the display device having the above-described configuration, heat generated during the operation of the semiconductor chip 5 is transmitted to the housing 25 and dissipated. Accordingly, it is possible to prevent the deterioration of the quality of display from occurring in the vicinity of the portion for mounting the semiconductor device due to the influence of the heat generated by the semiconductor chip 5.

Figure 15:
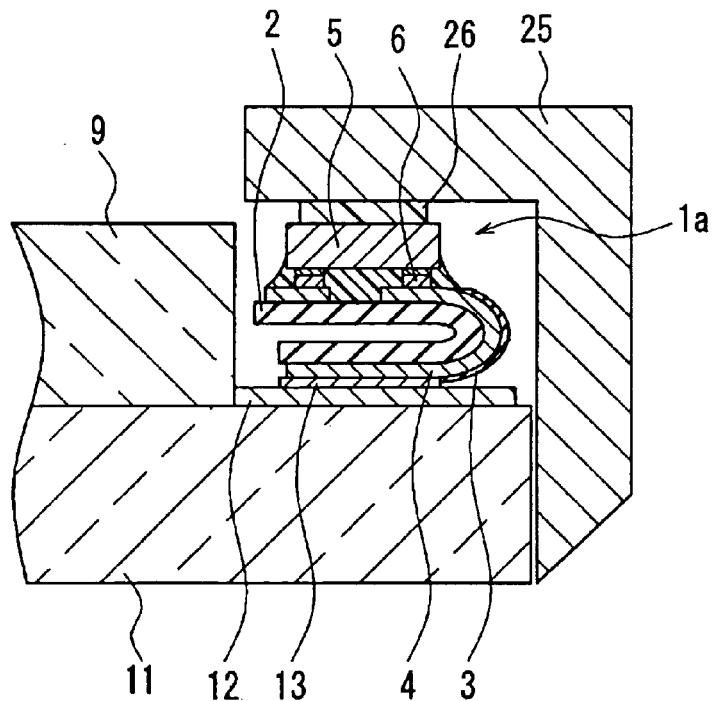
FIG. 15 is a cross-sectional view of another display device according to Embodiment 3 of the present invention.

Furthermore, as shown in FIG. 15, it is preferable that a heat transmitting material 26 having a high thermal conductivity intervenes between the rear surface of the semiconductor chip 5 and the housing 25. As the heat transmitting material 26, a heat dissipating silicone rubber or the like may be used, for example. This further enhances the heat dissipation from the semiconductor chip 5, thereby preventing the deterioration of the quality of display due to the heat generated by the semiconductor chip 5.

It is to be noted here that, while FIGS. 14 and 15 show the display device on which the semiconductor device 1a according to Embodiment 1 is mounted, the semiconductor device 1c according to Embodiment 2 may be mounted instead of the semiconductor device 1a.

(Embodiment 4)

Figure 16:
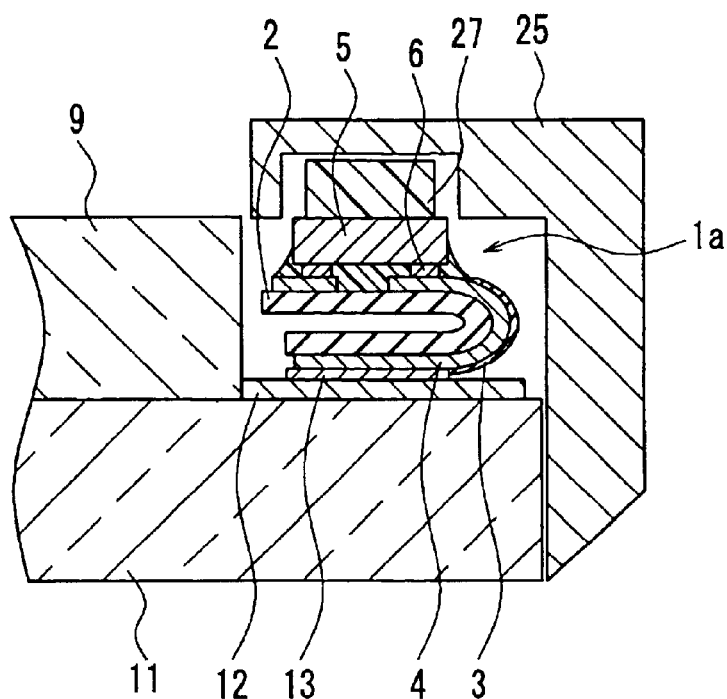
FIG. 16 is a cross-sectional view of a display device according to Embodiment 4 of the present invention.

A semiconductor device and a display device according to Embodiment 4 of the present invention will be described. FIG. 16 is a cross-sectional view of a display device according to Embodiment 4 of the present invention. In the semiconductor device according to Embodiment 4, a cooling device 27 is disposed on the rear surface of a semiconductor chip 5 so as to make intimate contact therewith. The cooling device 27 is a device capable of performing forced cooling. The cooling device 27 may be a Peltier device, for example. In the semiconductor device having the above-described configuration, it is possible to cool the semiconductor chip 5 forcefully, thereby preventing the semiconductor chip 5 from being brought to high temperature. Accordingly, it is possible to prevent the deterioration of the quality of display, such as irregularity in display, due to the heat generated by the semiconductor chip 5.

Figure 17:
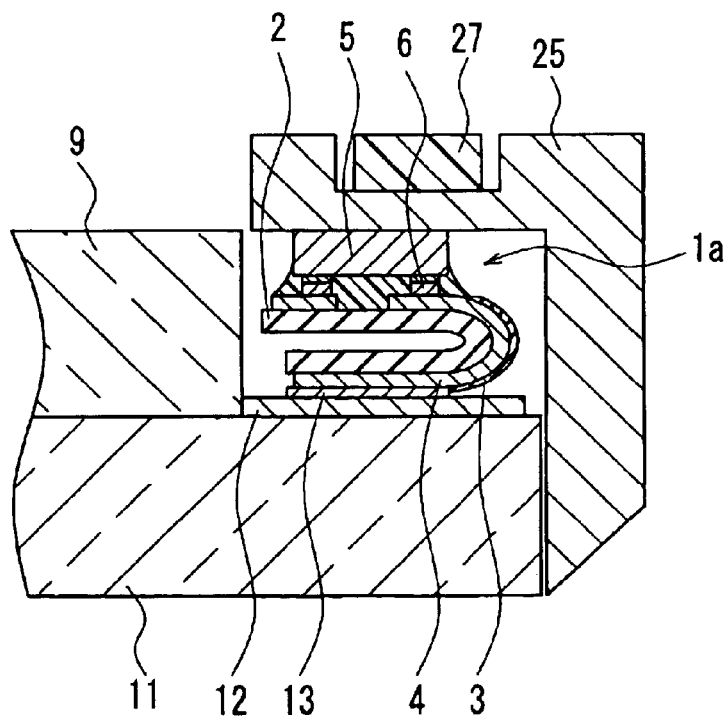
FIG. 17 is a cross-sectional view of another display device according to Embodiment 4 of the present invention.

Furthermore, as shown in FIG. 17, the influence of heat generated by the semiconductor chip 5 may be reduced by bringing the housing 25 into intimate contact with the rear surface of the semiconductor chip 5 and then disposing the cooling device 27 so as to make intimate contact with the housing 25 so that the housing 25 that absorbs and dissipates heat from the semiconductor chip 5 is cooled forcefully.

It is to be noted here that, while FIGS. 16 and 17 show the display device on which the semiconductor device 1a according to Embodiment 1 is mounted, the semiconductor device 1c according to Embodiment 2 may be mounted instead of the semiconductor device 1a.

(Embodiment 5)

Figure 18:
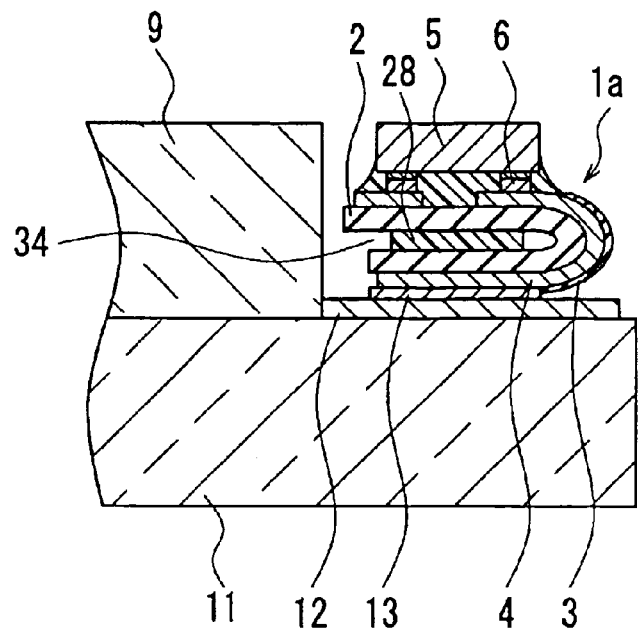
FIG. 18 is a cross-sectional view of a display device according to Embodiment 5 of the present invention.

Hereinafter, a semiconductor device and a display device according to Embodiment 5 of the present invention will be described. FIG. 18 is a cross-sectional view of a display device according to Embodiment 5 of the present invention. The display device according to Embodiment 5 has the same configuration as the display device according to Embodiment 1 shown in FIG. 3 except that a heat insulating layer 28 is formed in the space 34 formed between the film substrate 2 and a part thereof brought into proximity thereto by folding. The heat insulating layer 28 suppresses the transmission of the heat generated by the semiconductor chip 5 to the glass substrate 11. Because the heat from the semiconductor chip 5 is less liable to be transmitted to the glass substrate 11, it is possible to prevent the deterioration of the quality of display, such as irregularity in display.

The heat insulating layer 28 may be formed of a material having a low thermal conductivity. For example, a heat insulating material such as glass fiber may be used for forming the heat insulating layer 28. Instead of the heat insulating layer 28, a cooling device may be disposed in the space 34. This also can reduce the influence of the heat on the glass substrate 11.

Figure 19:
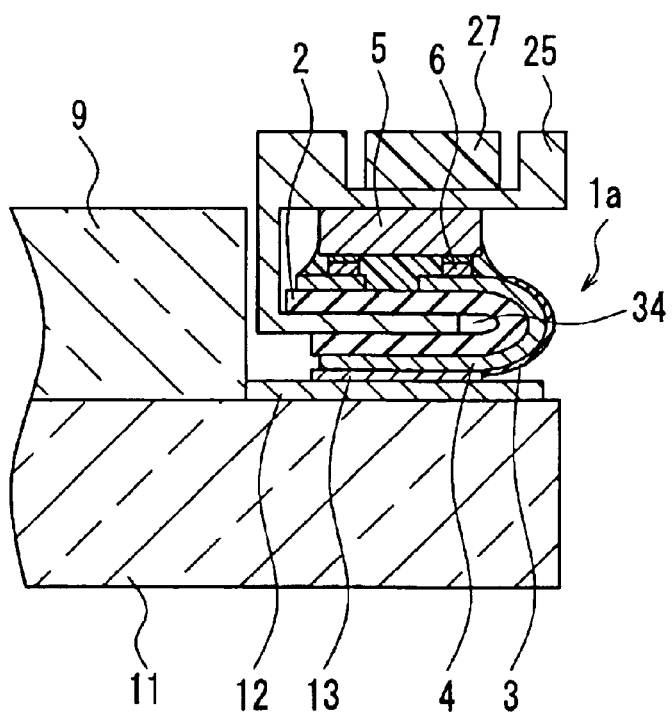
FIG. 19 is a cross-sectional view of another display device according to Embodiment 5 of the present invention.

Furthermore, as shown in FIG. 19, the display device may be configured so that the housing 25 provided with the cooling device 27 is in intimate contact with the rear surface of the semiconductor chip 5 and a part of the housing 25 extends into the space 34.

It is to be noted here that, while FIGS. 18 and 19 show the display device on which the semiconductor device 1a according to Embodiment 1 is mounted, the semiconductor device 1c according to Embodiment 2 may be mounted instead of the semiconductor device 1a.

(Embodiment 6)

Figure 20:
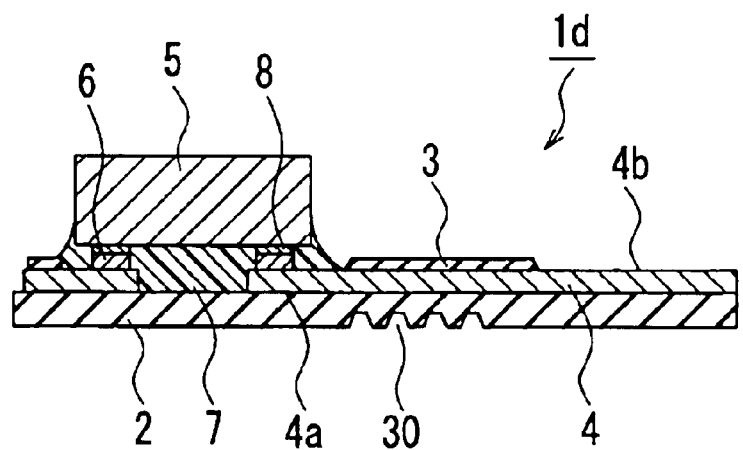
FIG. 20 is a cross-sectional view of a semiconductor device according to Embodiment 6 of the present invention.
Figure 21:
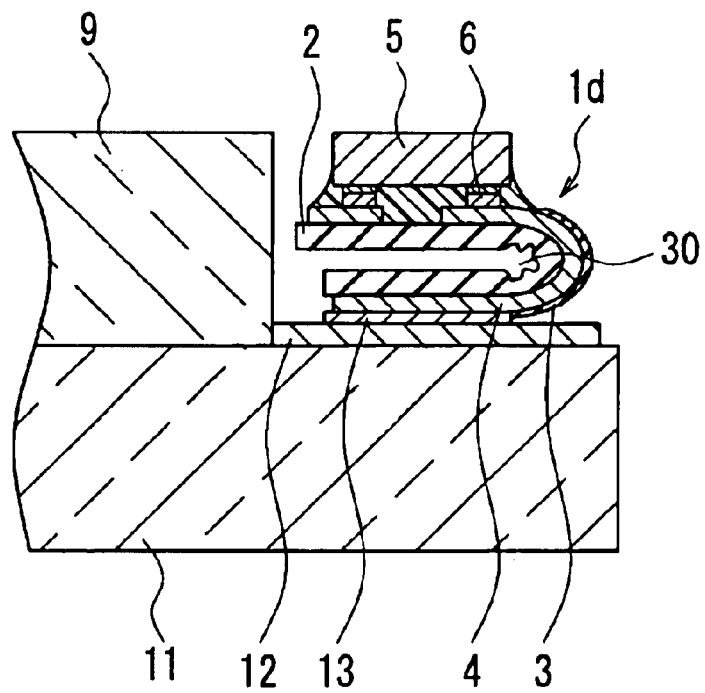
FIG. 21 is a cross-sectional view of a display device according to Embodiment 6 of the present invention.

A semiconductor device and a display device according to Embodiment 6 of the present invention will be described. FIG. 20 is a cross-sectional view of a semiconductor device according to Embodiment 6 of the present invention. As shown in FIG. 20, a semiconductor device 1d according to Embodiment 6 has the same configuration as that of the semiconductor device 1a according to Embodiment 1 shown in FIG. 1 except that recesses 30 are formed at a portion of the film substrate 2 to be bent when the semiconductor device 1d is mounted. FIG. 21 is a cross-sectional view of a display device according to Embodiment 6 of the present invention. In the display device according to Embodiment 6, the semiconductor device 1d is mounted on a glass substrate 11.

By providing recesses 30 on an inner peripheral surface of the bent portion of the film substrate 2, the film substrate 2 has a reduced restorative force against bending. The restorative force is generated due to the contractive force generated against the extension that reaches its maximum on the outer peripheral surface and the expansive force generated against the contraction that reaches its maximum on the inner peripheral surface when the film substrate 2 is folded. Thus, when the thickness of the film substrate 2 is made smaller by forming recesses 30 on the surface of the film, the difference in curvature between the inner periphery and the outer periphery of the bent portion becomes smaller, thereby reducing the restorative force against bending. This makes the folding of the film substrate 2 easier, thereby allowing the height of the semiconductor device 1d after being mounted to be made smaller. Therefore, the volume of the semiconductor device 1d can be made smaller, thereby allowing the semiconductor device to be mounted in a small space. As a result, the display device also can be made smaller.

Figure 22:
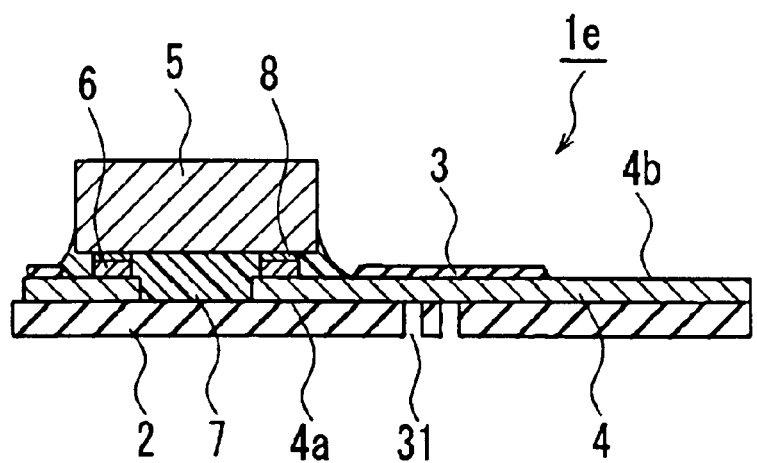
FIG. 22 is a cross-sectional view of another semiconductor device according to Embodiment 6 of the present invention.
Figure 23:
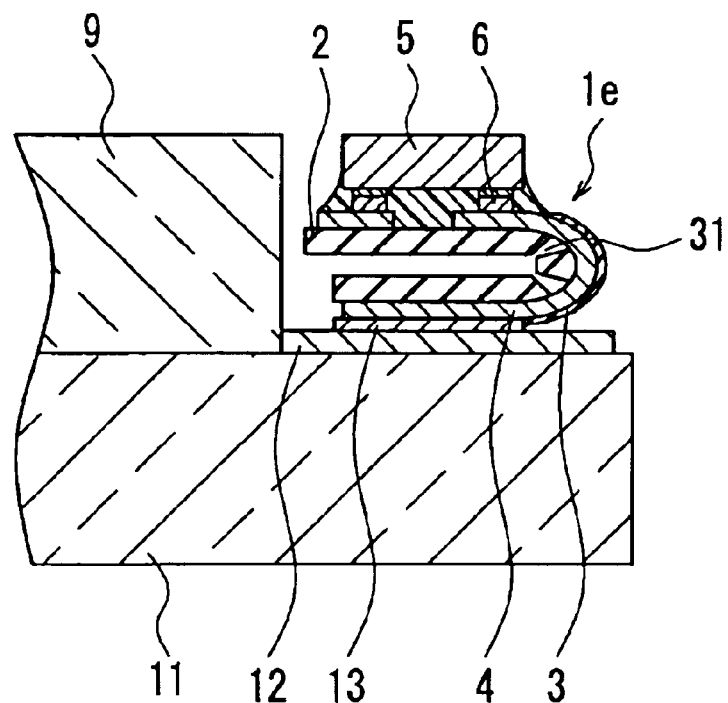
FIG. 23 is a cross-sectional view of another display device according to Embodiment 6 of the present invention.
Figure 24:
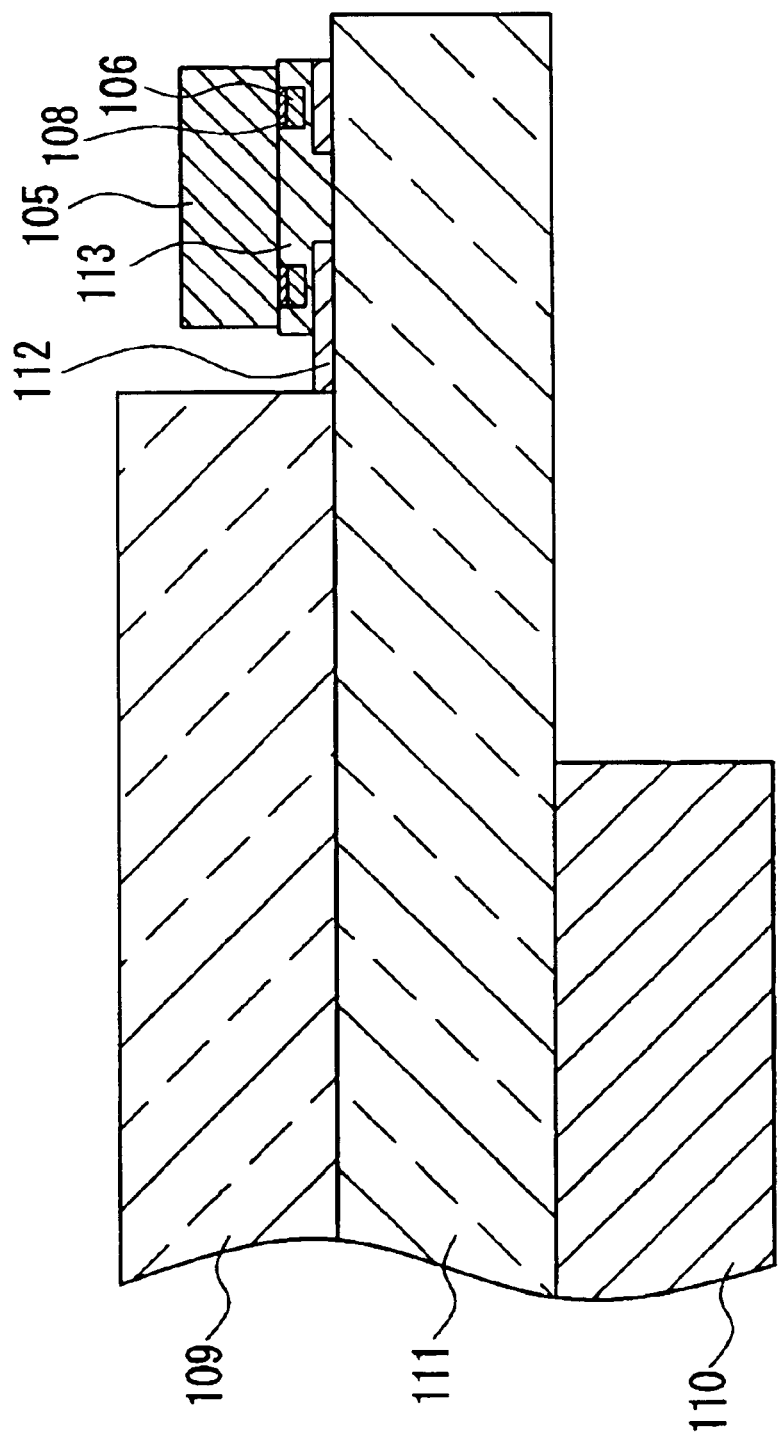
FIG. 24 is a cross-sectional view of a semiconductor device mounted on a display device so as to have a COG structure.
Figure 25:
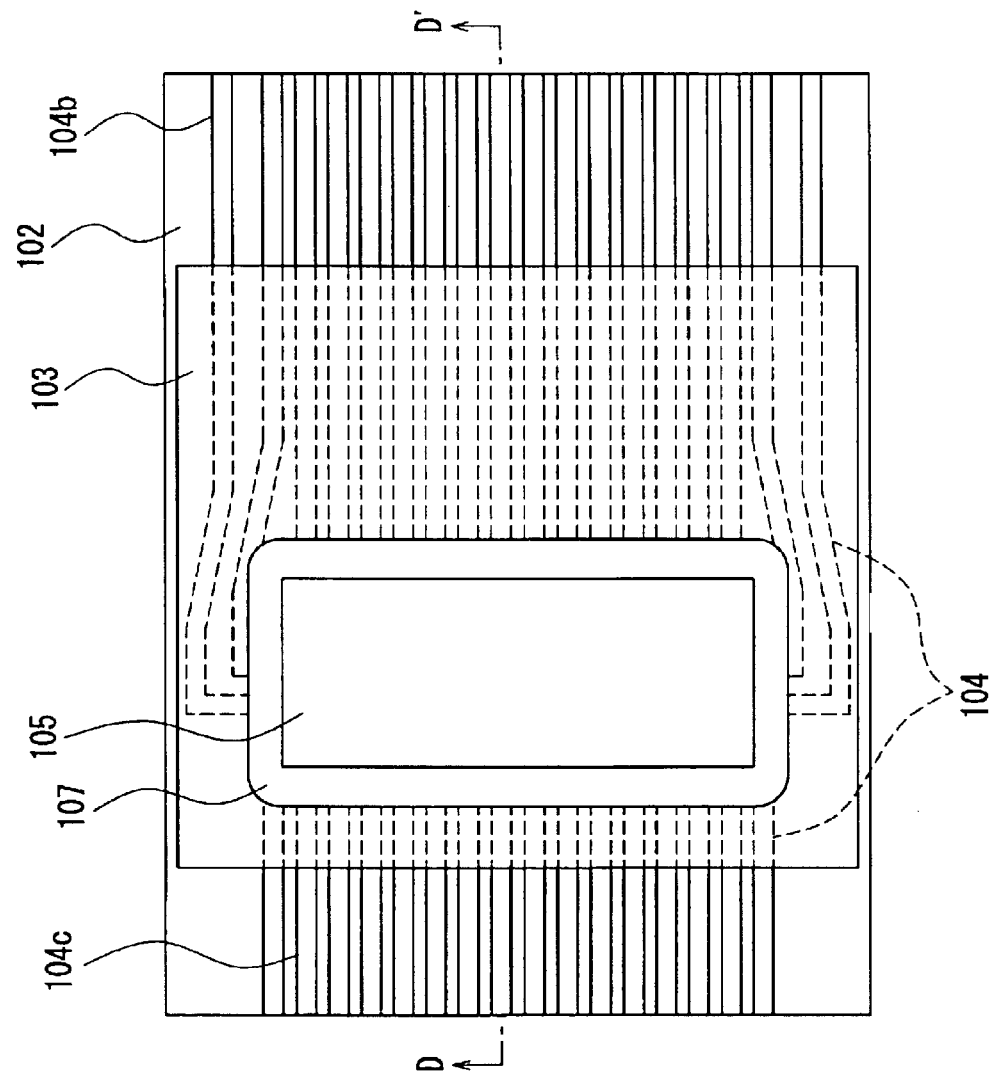
FIG. 25 is a plan view of a conventional semiconductor device with a COF structure.
Figure 26:
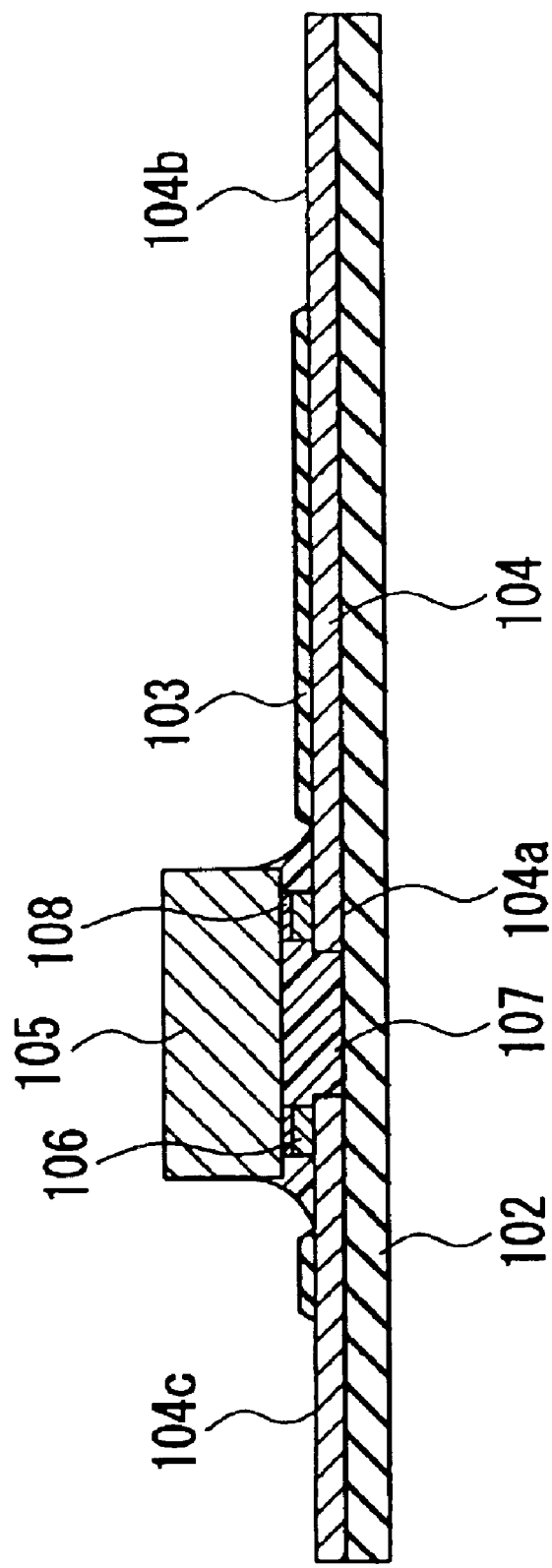
FIG. 26 is a cross-sectional view of the conventional semiconductor device with a COF structure, taken in the arrow direction of line D–D' in FIG. 25.
Figure 27:
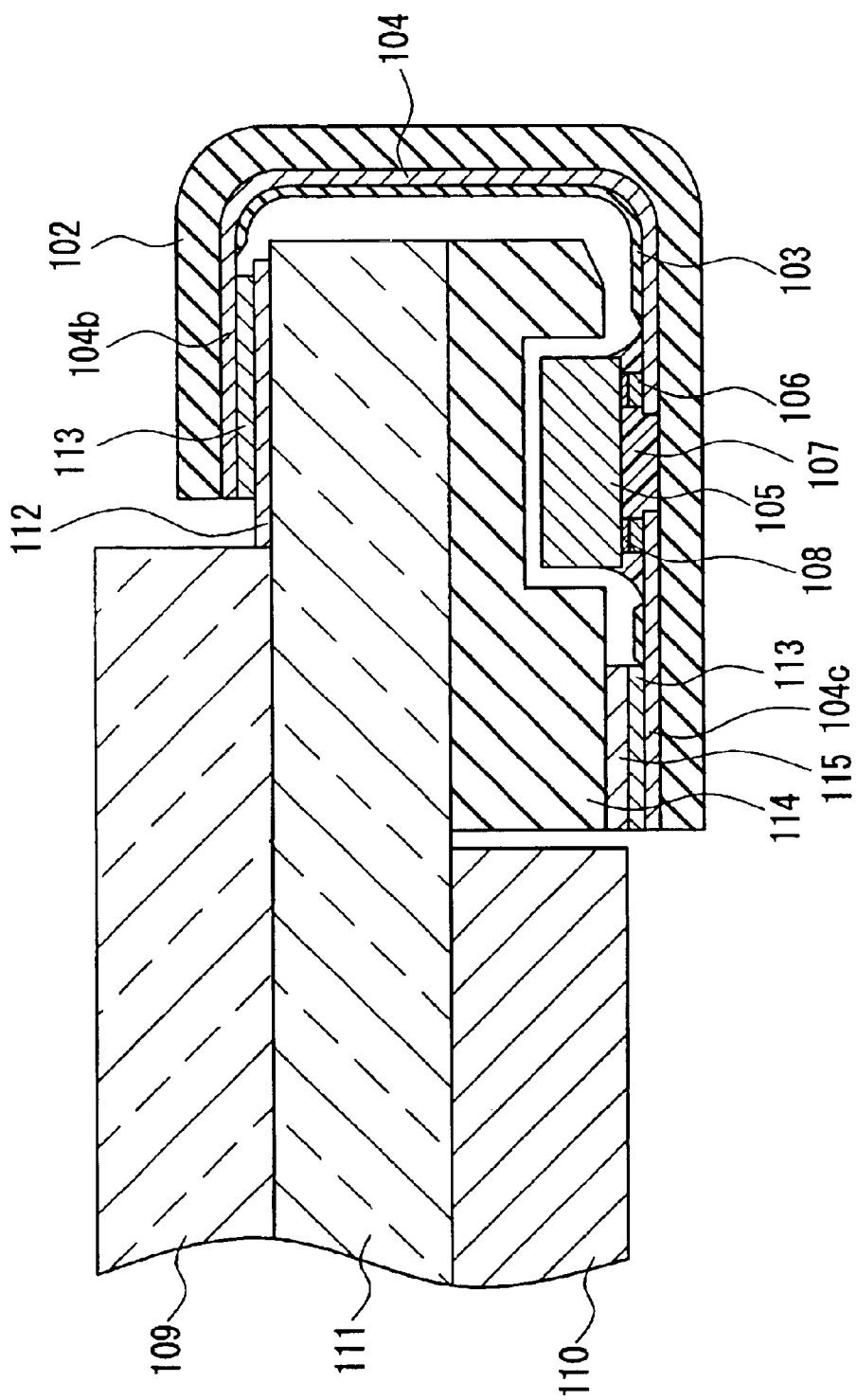
FIG. 27 is a cross-sectional view of the conventional semiconductor device with a COF structure mounted on a display device.

Also, as shown in FIGS. 22 and 23, a semiconductor device 1e in which through holes 31 are formed instead of recesses at a portion of the film substrate 2 to be bent when the semiconductor device 1e is mounted also is included in the embodiment of the present invention. Also in the case where the through holes 31 are formed, the restorative force is reduced because the surface area of the film substrate 2 is reduced. Therefore, the volume of the semiconductor device 1e when mounted on a display device can be made smaller.

The recesses 30 and the through holes 31 may be machined by performing etching, pressing, or the like, for example.

It is to be noted here that, in the display devices according to Embodiments 3 to 5, the semiconductor device 1d or 1e according to Embodiment 6 may be mounted instead of the semiconductor device 1a.

It is also to be noted here that the semiconductor devices 1a, 1b, 1c, 1d, and 1e described in Embodiments 1 to 6 can realize various modules such as SIP (System In Package). Thus, the semiconductor devices 1a, 1b, 1c, 1d, and 1e may be mounted not only on a display device but also on a substrate of portable devices required to be smaller and thinner, such as a cellular phone, PDA (Personal Digital Assistant), or the like in the same manner as in the display device.

The material and configuration of the components specifically described in Embodiments 1 to 6 are only illustrative, and the present invention is not limited to these specific examples.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device to be mounted on an external electronic device comprising:
   a film substrate having a first surface on which wiring electrodes are formed, the wiring electrodes being partially covered with a covering member; and
   a semiconductor chip mounted on the first surface of the film substrate,
   wherein the film substrate is folded so that a second surface of the film substrate and portions of the wiring electrodes exposed from the covering member on the first surface face and are to be connected to electrodes of an external electronic device.

2. The semiconductor device according to claim 1, wherein the semiconductor chip includes protruding electrodes and is connected to the wiring electrodes formed on the film substrate via the protruding electrodes.

3. The semiconductor device according to claim 1, further comprising an electronic-component-mounting region on which an electronic component is mounted, the electronic component-mounting region being formed on the first surface,
   wherein the film substrate is folded so that the electronic-component-mounting region faces the second surface.

4. The semiconductor device according to claim 3, wherein the electronic component includes at least one of a resistor and a capacitor.

5. The semiconductor device according to claim 1, wherein a recess or a through hole is formed on an inner peripheral surface of a bent portion of the folded film substrate.

6. The semiconductor device according to claim 1, further comprising a heat dissipation member that is in intimate contact with the semiconductor chip,
   wherein the heat dissipation member is provided on a side of the semiconductor chip opposite to a film substrate side of the semiconductor chip.

7. The semiconductor device according to claim 1, further comprising a cooling device that is in intimate contact with the semiconductor chip,
   wherein the cooling device is provided on a side of the semiconductor chip opposite to a film substrate side.

8. The semiconductor device according to claim 1, wherein a heat insulating layer is formed in a space defined by the inner surface of the folded film substrate.

9. The semiconductor device according to claim 1, wherein a cooling device is formed in a space defined by the inner surface of the folded film substrate.

10. The semiconductor device according to claim 1, wherein regions excluding bent portions located on both ends of the film substrate face each other.

11. A display device comprising:
    a display substrate;
    a transparent substrate provided on a surface of the display substrate;
    transparent electrodes formed on the surface of the display substrate, the transparent electrodes being formed on a portion without the transparent substrate on the surface of the display substrate; and a semiconductor device connected to the transparent electrodes, the semiconductor device comprising:
  a film substrate having a first surface on which wiring electrodes are formed, the wiring electrodes being partially covered with a covering member; and
  a semiconductor chip mounted on the first surface of the film substrate,
  the film substrate is folded so that a second surface of the film substrate that is on a side opposite to the first surface is an inner surface of the folded film substrate and portions of the wiring electrodes exposed from the covering member on the first surface are connected to the transparent electrodes.

12. The display device according to claim 11, wherein, in a state where the semiconductor device is connected to the transparent electrodes, a mounting height of the semiconductor device as measured from the surface of the display substrate is smaller than a thickness of the transparent substrate.

13. The display device according to claim 11, wherein, in a state where the semiconductor device is connected to the transparent electrodes, an orthogonal projection of the semiconductor device projected on the surface of the display substrate is in a portion without the transparent substrate on the surface of the display substrate and is accommodated within the display substrate.

14. The display device according to claim 11, wherein a plurality of the semiconductor devices are provided adjacent to each other, and connection between each two adjacent semiconductor devices is achieved via a connecting wire formed on the display substrate.

15. The display device according to claim 14, wherein each of the semiconductor devices includes a through wire for transmitting power common to all the semiconductor devices or signals, the through wire being provided in a space between the semiconductor chip and the film substrate in each of the semiconductor devices,
  wherein the power common to all the semiconductor devices or the signals transmitted via the through wire are transmitted sequentially to the semiconductor chips of the semiconductor devices adjacent to each other via the connecting wires.

16. The display device according to claim 15, wherein the through wire is formed on the film substrate of each of the semiconductor devices.

17. The display device according to claim 15, wherein the through wire is formed on the semiconductor chip of each of the semiconductor devices.

* * * * *